(12) United States Patent
Skurnik et al.

(10) Patent No.: US 7,491,919 B2
(45) Date of Patent: Feb. 17, 2009

(54) CIRCUIT FOR DETECTING A CLOCK ERROR IN A SCANNED-IMAGE SYSTEM AND RELATED CIRCUITS, SYSTEMS, AND METHODS

(75) Inventors: David Skurnik, Kirkland, WA (US); Mark Freeman, Snohomish, WA (US); Randy Sprague, Carnation, WA (US); Margaret Brown, Seattle, WA (US); Harpal Sira, Surrey (CA)

(73) Assignee: Microvision, Inc., Redmond, WA (US)

( * ) Notice: Subject to any disclaimer, the term of this patent is extended or adjusted under 35 U.S.C. 154(b) by 389 days.

(21) Appl. No.: 11/316,683

(22) Filed: Dec. 21, 2005

(65) Prior Publication Data

US 2006/0187497 A1    Aug. 24, 2006

Related U.S. Application Data

(60) Provisional application No. 60/638,274, filed on Dec. 21, 2004.

(51) Int. Cl.
  *H01L 27/00* (2006.01)
  *H01J 3/14* (2006.01)
(52) U.S. Cl. .................................. 250/208.1; 250/234
(58) Field of Classification Search .................. 250/205, 250/208.1, 234; 347/225, 247, 250; 359/196, 359/197, 202, 212, 213, 223–226
See application file for complete search history.

(56) References Cited

U.S. PATENT DOCUMENTS

| 4,518,998 | A | | 5/1985 | Warner et al. |
| 4,635,000 | A | | 1/1987 | Swanberg et al. |
| 4,959,669 | A | | 9/1990 | Haneda et al. |
| 5,121,138 | A | * | 6/1992 | Schermer et al. ............ 347/250 |
| 5,808,658 | A | | 9/1998 | Hoover et al. |
| 7,050,080 | B2 | * | 5/2006 | Ema et al. .................... 347/235 |
| 2001/0006544 | A1 | | 7/2001 | Kawasaki et al. |
| 2004/0004585 | A1 | | 1/2004 | Brown et al. |
| 2004/0119004 | A1 | | 6/2004 | Wine et al. |
| 2006/0187497 | A1 | | 8/2006 | Skumiuk et al. |
| 2006/0267968 | A1 | | 11/2006 | Straka et al. |

* cited by examiner

*Primary Examiner*—Que T Le
*Assistant Examiner*—Pascal M Bui-Pho
(74) *Attorney, Agent, or Firm*—Kevin D. Wills

(57) ABSTRACT

A circuit for detecting a phase error between a clock signal and a beam position includes a beam generator, a sensor, and a phase detector. The beam generator directs a beam toward a beam sweeper in response to the clock signal, and the sensor detects the beam as directed from the beam sweeper. The phase detector determines from the detected beam the error in the clock phase relative to the beam position. Such a circuit can automatically detect the phase error in the pixel clock and correct this error, thus eliminating the need for a manual phase-error corrector. The circuit may also be able to adjust the width and/or the height of a scan region, and thus may also be able to adjust the width and/or height of an image frame within the scan region.

13 Claims, 17 Drawing Sheets

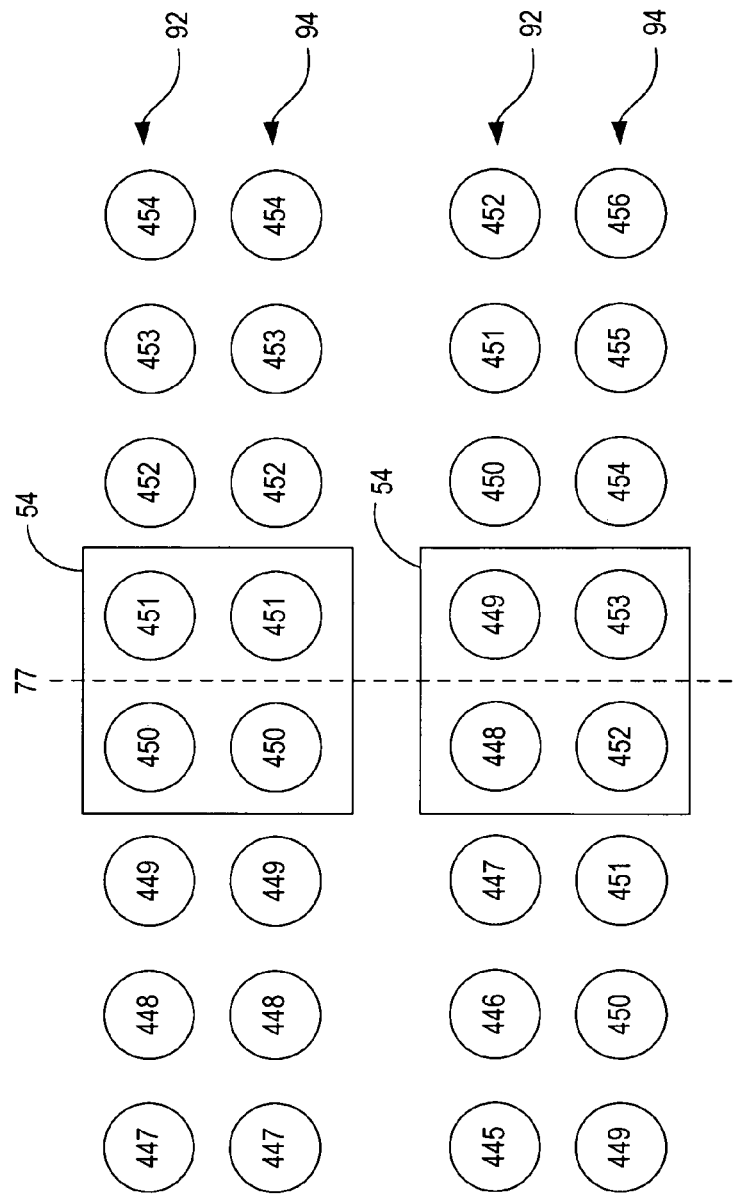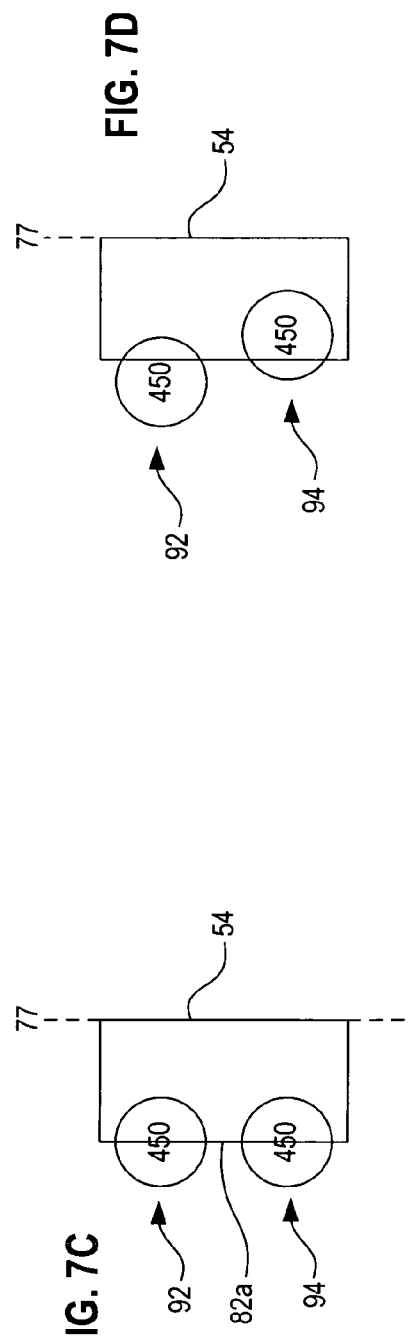

CIRCUIT FOR DETECTING A CLOCK ERROR IN A SCANNED-IMAGE SYSTEM AND RELATED CIRCUITS, SYSTEMS, AND METHODS

CLAIM OF PRIORITY

This application claims priority to U.S. Provisional Application Ser. No. 60/638,274, filed on Dec. 21, 2004, which is incorporated by reference.

CROSS REFERENCE TO RELATED APPLICATIONS

This application is related to U.S. patent application Ser. No. 11/316,326, entitled CIRCUIT FOR DETECTING A CLOCK ERROR IN A SWEPT-BEAM SYSTEM AND RELATED SYSTEMS AND METHOD, which has a common filing date and assignee and which is incorporated by reference.

BACKGROUND

Referring to FIG. 1, in a scanned-image system 10 that sweeps a beam 12 to generate or capture an image (not shown in FIG. 1), the image may exhibit noticeable distortion if the pixel clock (not shown in FIG. 1) is not synchronized to the position of the beam.

Assume, for example, that the scanned-image system 10 is a bidirectional image-generating system. A beam sweeper, such as a microelectromechanical (MEMS) mirror 14, rotates back and forth about an axis 16 to sweep the beam 12 through a scan angle $2\theta$ such that each left-to-right and right-to-left sweep of the beam generates a respective line of the image (not shown in FIG. 1). In an image plane 18, which may be occupied by a display screen or, in the case of a virtual retinal display, by a viewer's retina, the mirror 14 sweeps the beam 12 through a scan distance D. Although in this example the generated image is described as spanning the entire scan distance D, the image may span only a portion of the scan distance as discussed below in conjunction with FIGS. 2-4. Furthermore, although three instances of the swept beam 12 are shown, it is understood that the beam may be in only one position at any one time. According to alternative embodiments, a plurality of beams 12 may be swept across the image plane 18.

The pixel clock (not shown in FIG. 1) dictates the pixel that the beam 12 generates at a particular time; therefore, if the pixel clock is synchronized with the position of the beam, then the pixel clock causes the beam to generate a left-most pixel of the image (not shown in FIG. 1) when the beam is in the left-most position L, a center pixel when the beam is in the center position C, and a right-most pixel when the beam is in the right-most position R.

But if the pixel clock is not synchronized with, i.e., is out of phase with, the position of the beam 12, then the generated image may be distorted to a degree that is proportional to the phase error between the pixel clock and the beam. As an extreme example of this phase-error distortion, assume that the phase of the pixel clock lags the position of the beam 12 by D/2 during a left-to-right sweep of the beam; consequently, the pixel clock causes the beam to generate a left-most pixel of the image when the beam is in the center position C, and to generate a center pixel when the beam is in the right position R. And during the following right-to-left sweep of the beam 12, the pixel clock causes the beam to generate the right-most pixel of the previous line when the beam is in the center position C of the current line.

Referring to FIGS. 2-4, an example of the image distortion resulting from a phase error in a pixel clock (not shown in FIGS. 2-4) of the scanned-image system 10 (FIG. 1) is discussed in more detail. In this example, the MEMS mirror 14 resonates back and forth from left to right, thus causing the position of the beam 12 to be sinusoidal relative to time as shown in FIG. 2.

FIG. 2 is a plot of the horizontal position of the beam 12 in the image plane 18 (FIG. 1) versus time over one sweep period T (one left-to-right sweep followed by one right-to-left sweep), with horizontal position being plotted on the vertical axis. Image fields 20 and 22, which the beam respectively generates during the left-to-right and right-to-left sweeps, indicate respective field positions for a pixel-clock phase error of zero. Image fields 24 and 26, which the beam 12 respectively generates during the left-to-right and right-to-left sweeps, indicate respective field positions for an illustrative non-zero pixel-clock phase error.

FIG. 3 is a plan view of an undistorted image frame 28 formed in the image plane 18 by the interleave of the left-to-right and right-to-left image fields 20 and 22 of FIG. 2 for a zero pixel-clock phase error.

FIG. 4 is a plan view of a distorted image frame 30 formed in the image plane 18 by the interleave of the left-to-right and right-to-left image fields 24 (solid line) and 26 (dashed line) of FIG. 2 for a nonzero pixel-clock phase error.

Referring to FIGS. 1-3, assume that one desires to generate within a scan region 31 of the image plane 18 an image frame 28, which includes a vertical line 32 located at a horizontal position between D/5 and 4D/5; therefore, the frame 28 has a width W=3D/5 and is horizontally centered within the scan region. The scan region 31 is defined in the horizontal dimension by the scan distance D and in the vertical dimension by a scan distance V. Borders 34a and 34b between the sides of the scan region 31 and the image frame 28, here indicated as being D/5 wide, may be included, for instance to reduce raster-pinch distortion or provide one or more other advantages.

Because the pixel-clock phase error equals zero, during each left-to-right sweep of the beam 12 the pixel clock may cause the beam to generate a respective horizontal line of the left-to-right image field 20 for a duration $T_{imagefield}$ between times $t_1$ and $t_2$, which respectively correspond to the beam positions D/5 and 4D/5. Some of the horizontal sweeps of the left-to-right image field 20 include segments 36 of the vertical line 32.

Likewise, during each right-to-left sweep of the beam 12, the pixel clock may cause the beam to generate a respective horizontal line of a right-to-left image field 22 for the duration $T_{imagefield}$ between times $t_3$ and $t_4$, which also respectively correspond to the beam positions 4D/5 and D/5. Some of the horizontal sweeps of the right-to-left image field 22 include segments 38 of the vertical line 32.

Referring to FIG. 3, because both of the image fields 20 and 22 are centered within the scan region 31 and have the same horizontal width W and vertical height H, these fields are aligned in the both the horizontal and vertical dimensions; consequently, the vertical-line segments 36 and 38 are aligned such that in the image frame 28, the vertical line 32 has straight edges.

Referring to FIGS. 1-2 and 4, however, a phase error between the pixel clock and the position of the beam 12 may cause the vertical line 32 to appear jagged, or in the extreme case illustrated in FIG. 4, appear as two separate vertical lines 32a and 32b. For example, assume that the pixel clock lags the beam position by a time $T_{lag}$. Therefore, during each left-to-right sweep of the beam 12, the pixel clock causes the beam to generate a respective horizontal line of a left-to-right image field 24 from time t1' to time t2'. Likewise, during each right-to-left sweep of the beam 12, the pixel clock causes the beam to generate a respective horizontal line of a right-to-left image field 26 from time t3' to time t4'. Consequently, as shown in FIG. 4, the image field 24 (solid line) is shifted to the right relative to the center of the scan region 31, and the image field 26 (dashed line) is shifted to the left such that these fields are not horizontally aligned as are the image fields 20 and 22 of FIG. 3. This shifting of the image frames 24 and 26 in opposite directions causes the resulting image frame 30 to be distorted in the horizontal dimension. And this distortion causes a misalignment of the vertical-line segments 36 and 38 such that the vertical line 32 now appears to a viewer (not shown) as the two vertical lines 32a and 32b, or for a smaller phase error, as a single vertical line 32 with jagged edges (not shown). Although not shown in FIGS. 3-4, distortion can occur in the vertical dimension if the pixel clock is not synchronized to the vertical position of the beam 12.

SUMMARY

An embodiment of a circuit for detecting a phase error between a clock signal and a beam position includes a beam generator, a sensor, and a phase detector. The beam generator directs a beam toward a beam sweeper in response to the clock signal, and the sensor detects the beam as directed from the beam sweeper. The phase detector determines from the detected beam the error in the clock phase relative to the beam position.

Such a circuit can automatically detect the phase error in a pixel clock and correct this error, thus eliminating the need for a manual phase-error corrector.

Furthermore, other embodiments of the circuit can adjust the width and/or height of a scan region, and thus can adjust the width and/or height of an image frame within the scan region.

BRIEF DESCRIPTION OF THE DRAWINGS

FIGS. 7A-7B illustrate a technique for determining the phase error of the pixel clock of FIG. 5 according to an embodiment.

FIGS. 7C-7D illustrate another technique for determining the phase error of the pixel clock of FIG. 5 according to an embodiment.

DETAILED DESCRIPTION

The following discussion is presented to enable a person skilled in the art to make and use one or more embodiments of the invention. The general principles described herein may be applied to embodiments and applications other than those detailed below without departing from the spirit and scope of the invention. Therefore the present invention is not intended to be limited to the embodiments shown, but is to be accorded the widest scope consistent with the principles and features disclosed or suggested herein.

Figure 1:
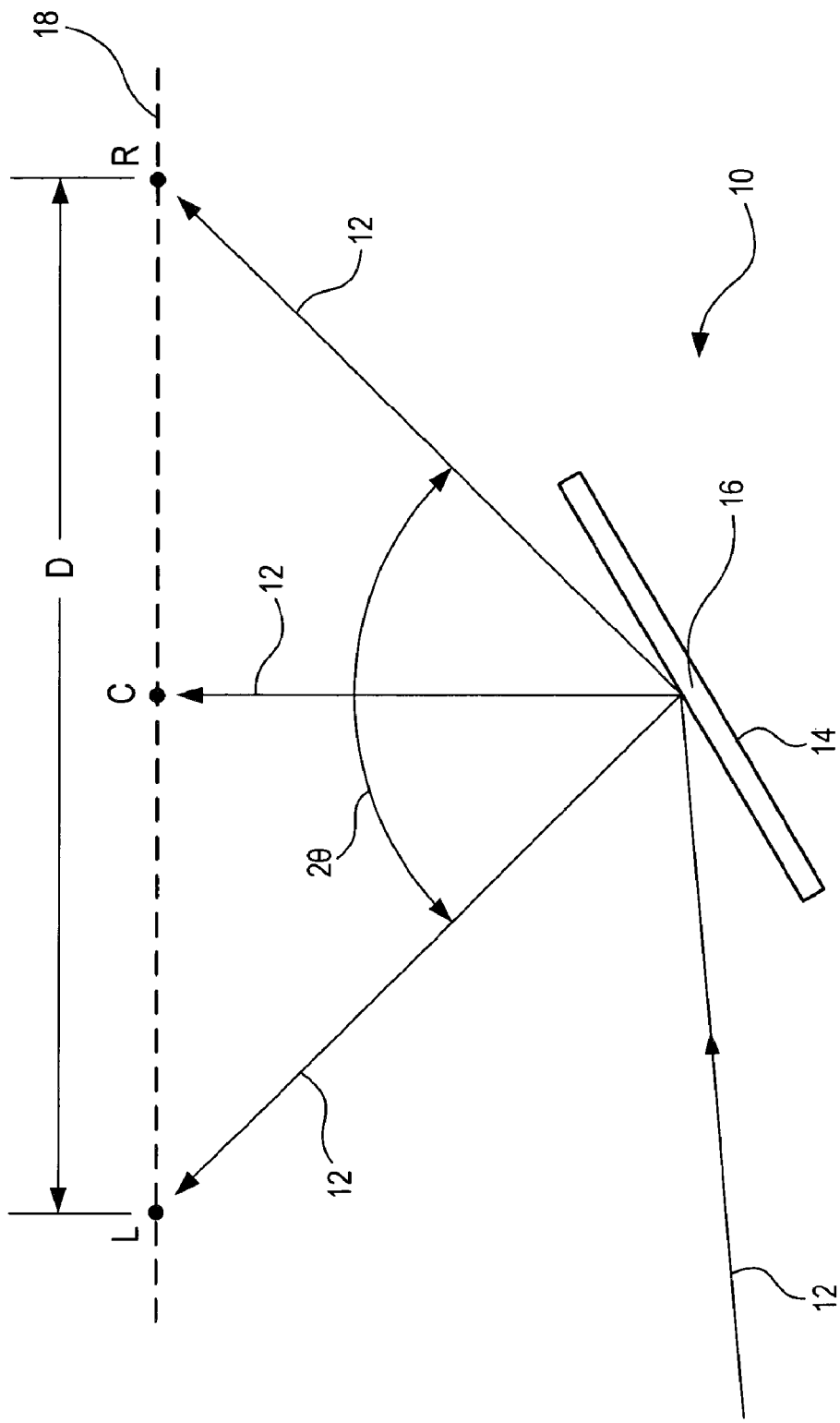
FIG. 1 is a plan view of a conventional scanned-image system.
Figure 3:
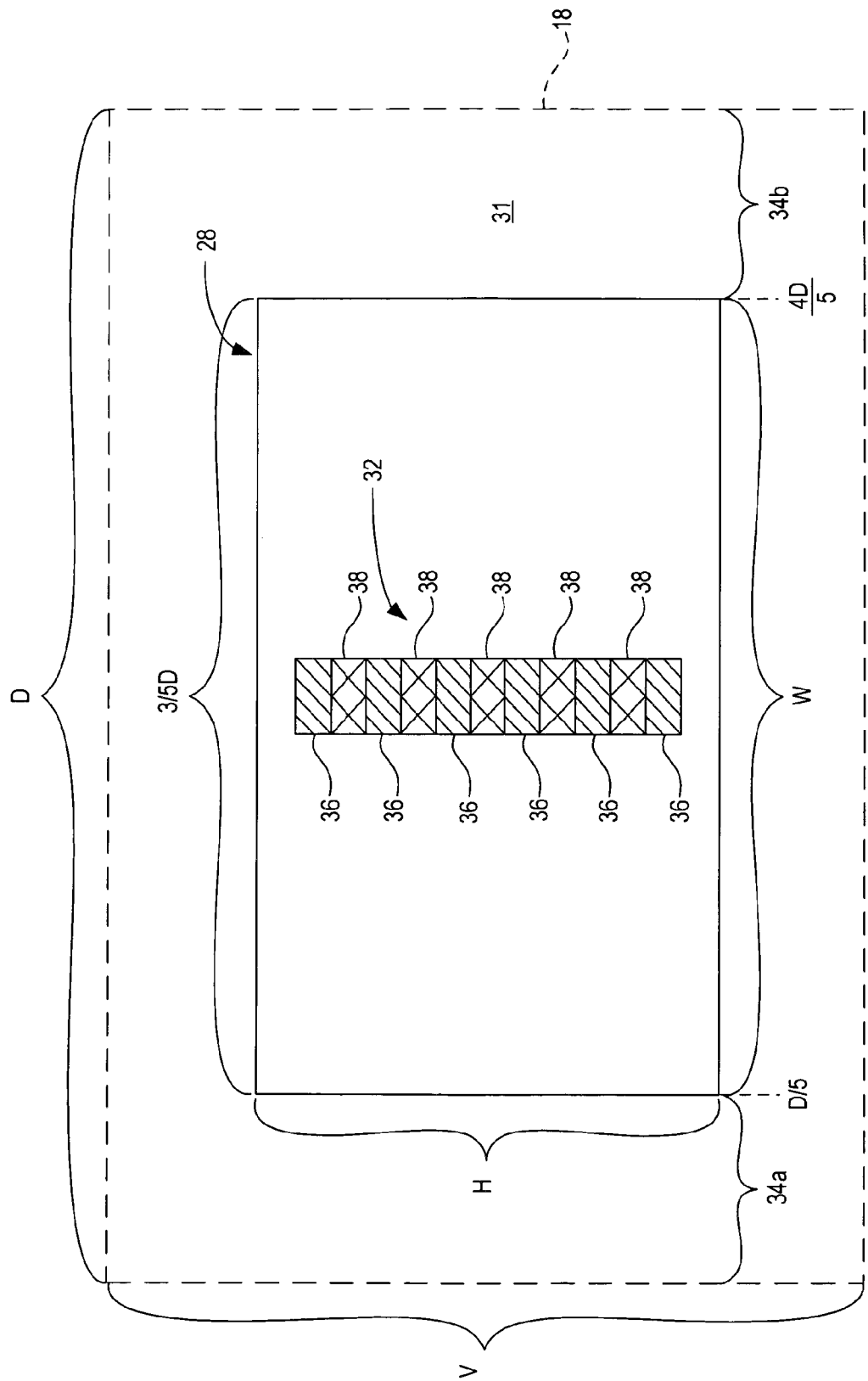
FIG. 3 is an image frame formed by the interleave of the left-to-right and right-to-left image fields of FIG. 2 for a zero pixel-clock phase error.
Figure 4:
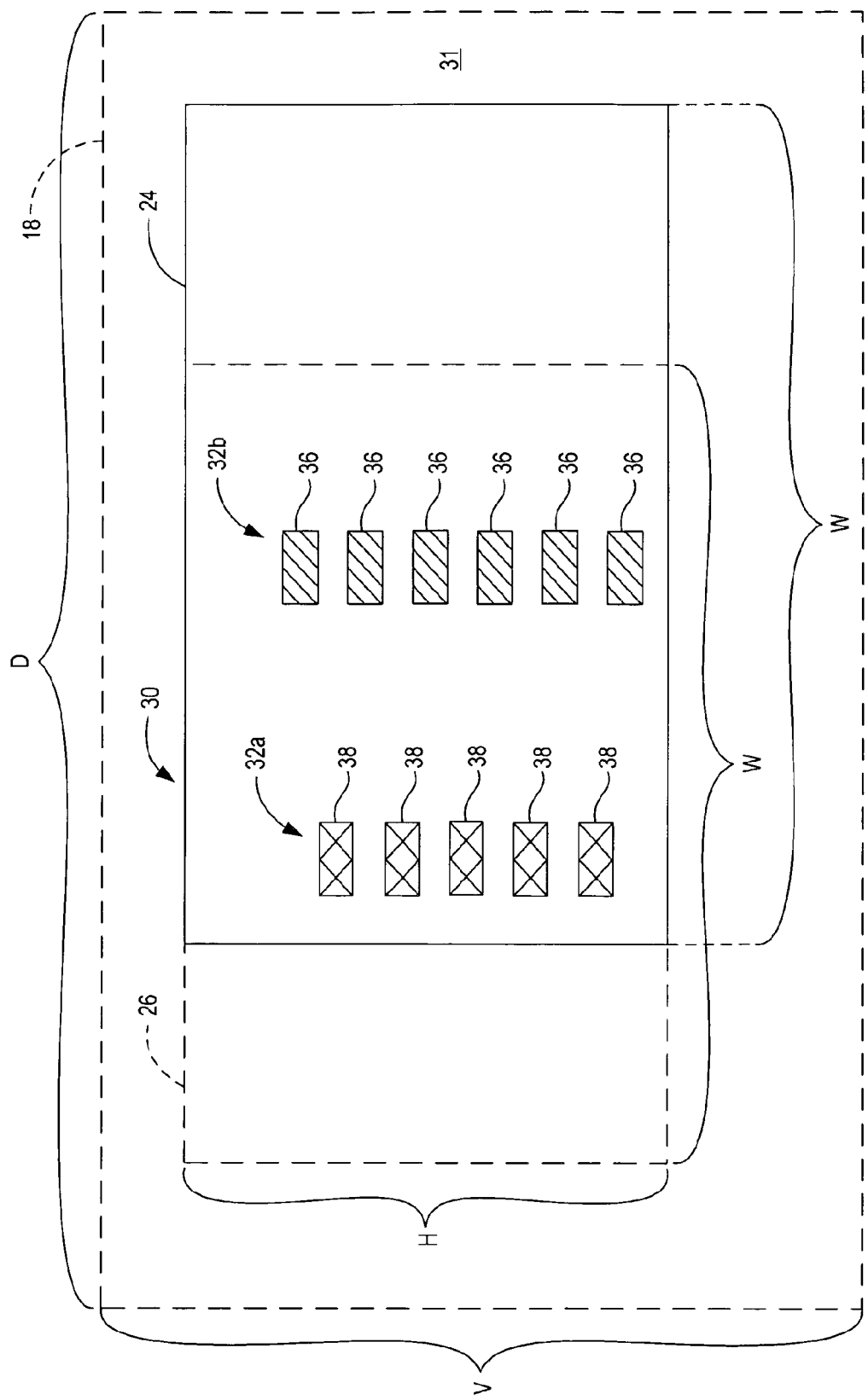
FIG. 4 is an image frame formed by the interleave of the left-to-right and right-to-left image fields of FIG. 2 for a nonzero pixel-clock phase error.

Referring to FIGS. 1 and 4, a technique for correcting a nonzero pixel-clock phase error is to provide the scanned-image system 10 with a manual control (not shown) that a viewer (not shown) manipulates until the image within the frame 30 has a good quality. For example, the viewer may manipulate the control to align the segments 36 and 38 into the line 32 (FIG. 3) having straight edges.

Unfortunately, this technique may be inconvenient for the viewer, and the manual control may increase the size, complexity, and cost of the scanned-image system 10.

Similarly, referring to FIG. 3, a technique for adjusting the width W and height H of the frame 28 is to provide the scanned image system 10 with one or more manual controls (not shown) that a viewer (not shown) manipulates until the frame has the desired width and height.

Unfortunately, like the manual phase-correction technique, this manual height-and-width adjustment technique may be inconvenient for the viewer, and the manual control(s) may increase the size, complexity, and cost of the scanned-image system 10.

Figure 5:
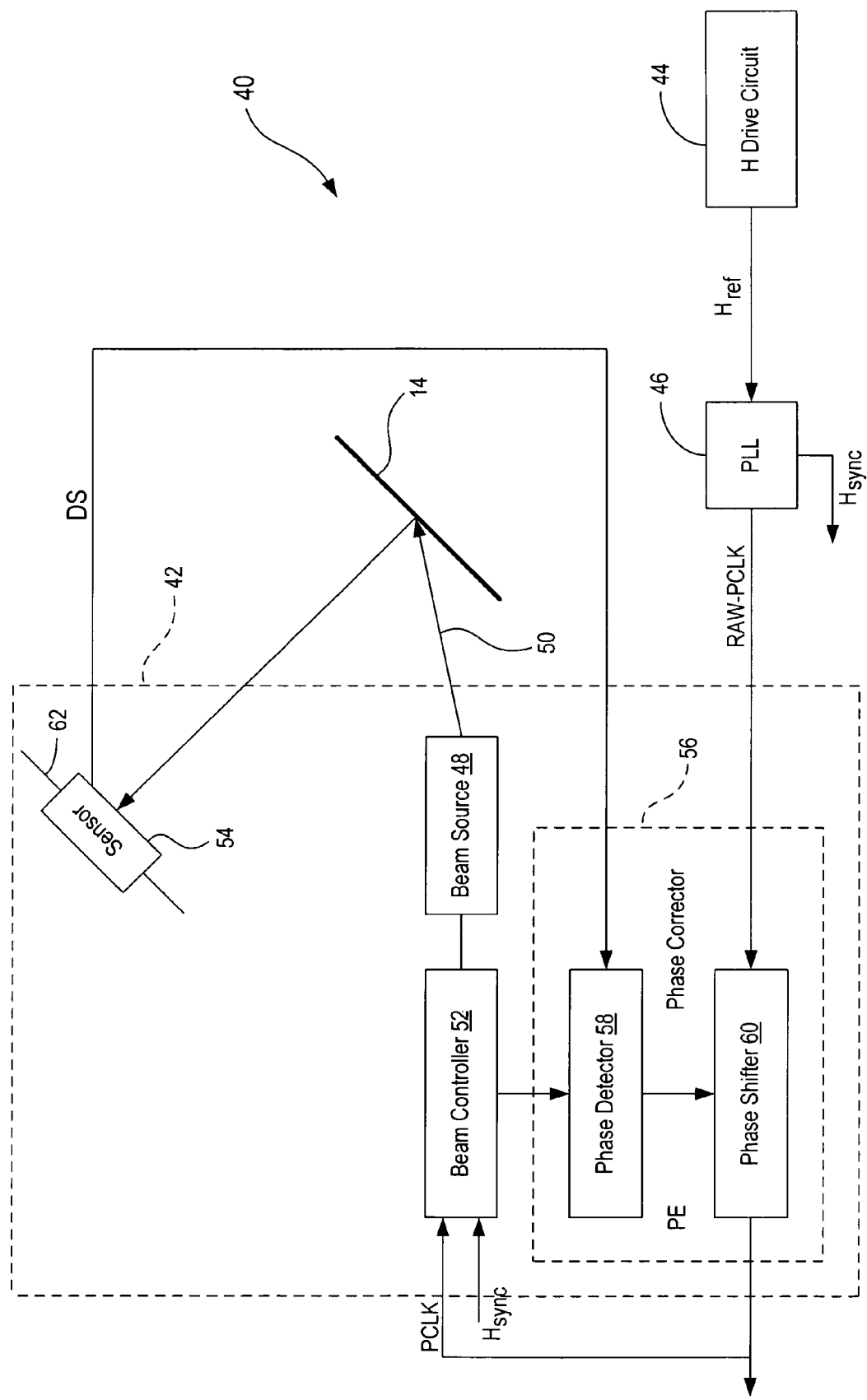
FIG. 5 is a block diagram of a scanned-image subsystem that includes a circuit for detecting and correcting a phase error in a pixel clock according to an embodiment.

FIG. 5 is a block diagram of a scanned-image subsystem 40, which includes a circuit 42 for detecting and correcting a phase error in a pixel clock PCLK.

In addition to the circuit 42, the subsystem 40 includes a beam sweeper such as the MEMS mirror 14 discussed above in conjunction with FIG. 1, a fast-scan drive circuit 44 for causing the mirror to rotate back and forth in a fast-scan dimension (the fast-scan dimension=the horizontal dimension in this embodiment), and a phase-locked-loop (PLL) circuit 46 for generating signals RAW_PCLK and $H_{sync}$. The drive circuit 44 generates a signal $H_{ref}$, which is a square wave having the same frequency as the signal (not shown) that the drive circuit generates for rotating the mirror 14, and the PLL 46 generates RAW_PCLK and $H_{sync}$ from $H_{ref}$ in a conventional manner. In one example, the mirror 14 rotates back and forth at a frequency of approximately 15 KHz and scans a scan region that is 900 pixels wide in the horizontal dimension, where the middle 800 pixels form the image (this leaves 50-pixel-wide horizontal borders between the sides of the image and the corresponding sides of the scan region), $H_{ref}$ and $H_{sync}$ each have a frequency of approximately 15 KHz, and RAW_PCLK has a frequency of approximately 13.5 MHz and is in phase with $H_{ref}$. But because of e.g., noise, signal delays, etc., $H_{ref}$ may be out of phase with the position of the mirror 14, and thus out of phase with the position of a beam that the mirror sweeps. Consequently, $H_{sync}$ and RAW_PCLK may also be out of phase with the position of the swept beam. According to another embodiment, the beam sweeper 14 may comprise a unidirectional beam sweeper such as a rotating polygon mirror for example. According to another embodiment, the beam sweeper 14 may scan bidirectionally but the beam source 48 (described below) may be enabled to produce lines or pixels unidirectionally.

The circuit 42 includes a beam source 48 for generating a synchronization beam 50, a beam-source controller 52, a beam sensor 54, and a phase corrector 56, which includes a phase detector 58 and a phase shifter 60. The controller 52 causes the beam source 48 to generate the synchronization beam 50 in response to a predetermined cycle of PCLK, the predetermined cycle corresponding to a predetermined pixel position within the horizontal line that the synchronization beam is currently sweeping. If the subsystem 40 is part of a scanned-image-generating system, then the synchronization beam 50 may comprise the beam or one of the beams that the subsystem 40 uses to generate an image, or may be a separate beam. If the subsystem 40 is part of a scanned-image-capturing system, then the synchronization beam 50 may comprise the beam or one of the beams that the subsystem uses to illuminate an object, the image of which the system is capturing, or may be a separate beam. According to an illustrative embodiment, the sensor 54 includes a single sensing region (e.g., the sensor comprises a single photo diode) mounted to a mask 62, the sensor being operable to detect the synchronization beam 50 as the mirror 14 sweeps the beam onto the sensor, and to generate a corresponding detection signal DS. As discussed below in conjunction with FIG. 6, the sensor 54 may be positioned at the horizontal center of the scan region within an upper or lower border of the scan frame (i.e., the sensor is positioned outside of the image frame). The phase detector 56 determines from the detection signal DS a phase error PE in PCLK relative to the position of the synchronization beam 50. The phase shifter 60 generates PCLK from RAW_PCLK, and, in response to the phase error PE from the phase detector 56, adds a corresponding phase shift to PCLK to reduce the phase error PE toward or to zero. For example, the phase shifter 60 may be able to adjust the phase of PCLK in increments as fine as ⅕-1/10 of a pixel.

Figure 6:
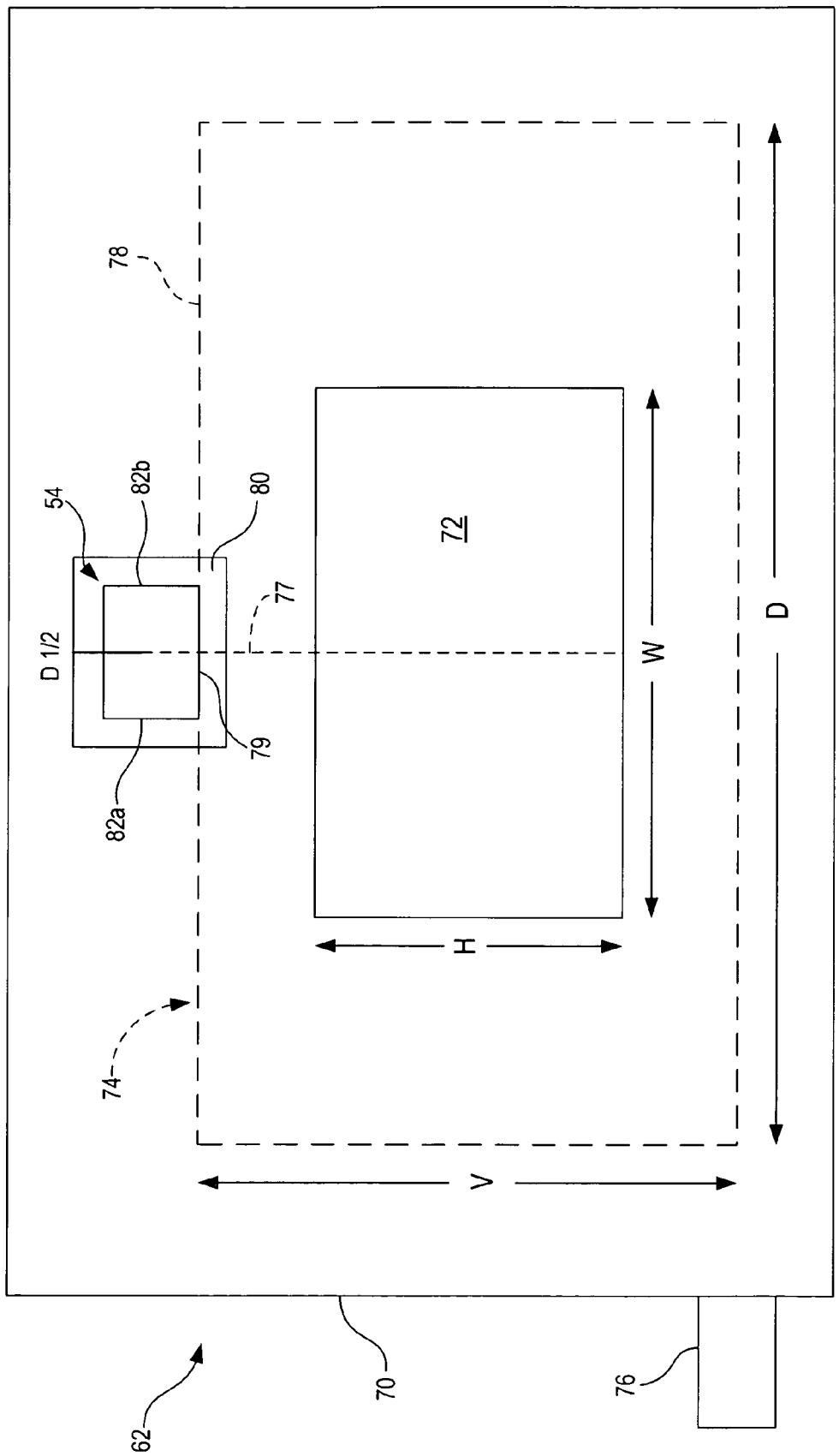
FIG. 6 is a plan view of a mask on which the sensor of FIG. 5 may be mounted according to an embodiment.

FIG. 6 is a plan view of the mask 62 and the sensor 54 of FIG. 5 according to an embodiment.

The mask 62 includes a frame 70, which defines an aperture 72 through which the subsystem 40 (FIG. 5) generates or captures an image frame (not shown in FIG. 6). The frame 70 is formed from a rigid or flexible material and may, for example, be clad with a copper foil or coating. The aperture 72 has horizontal and vertical dimensions W and H corresponding to the dimensions of the image frame in the plane of the mask 62, and, therefore, is ideally centered within a scan region 74 having horizontal and vertical dimensions D and V. An example of the dimensions of the aperture 72 is W=H=250 microns (μm).

The mask 62 also includes a connector 76 for connecting the signal lead or leads (not shown) of the sensor 54 to the phase detector 58 (FIG. 5).

According to some embodiments, the sensor 54 is mounted to the frame 70 such that the sensor is horizontally centered about a midline 77 between the two sides of the scan region 74, and thus between the two sides of the aperture 72. Furthermore, where the sensor 54 is also used to detect and correct an error in the height V of the scan region 74, as discussed below in conjunction with FIG. 15, the sensor is located in a predetermined position in the vertical dimension, for example, such that a bottom edge 78 of the sensor is aligned with a top edge 79 of the scan region 74. Alternatively, the sensor 54 may instead be mounted to the bottom of the mask 70, but horizontally and vertically aligned in a manner similar to that previously described.

The mask 62 may also include a sensor cover 80, which is mounted over the sensor 54 to define one or two edges, that may for example be straight, i.e., "knife's", edges 82*a* and 82*b*. As discussed below in conjunction with FIG. 7C, a knife's edge aids the phase detector 58 (FIG. 5) in determining what portion the beam 50 (FIG. 5) is striking the sensor 54. Alternatively, the cover 80 may be omitted where a knife's edge is not needed, or where the edge(s) of the sensor 54 is (are) straight enough to provide a knife's edge. Moreover, the edge 79 may also be a knife's edge, particularly where the sensor is used to adjust the height V of the scan region 74 as discussed below in conjunction with FIG. 15.

Still referring to FIG. 6, the sensor 54, copper-clad frame 70, and the cover 80 (if present) may be coated with a transparent or semi-transparent substance, such as polyimide, that protects the sensor, frame, and cover; and that may also be antireflective. Furthermore, where the transparent substance is polyimide and the synchronization beam 50 (FIG. 5) is a beam of red light, then the polyimide acts as a filter that allows the beam to propagate to the sensor 54 but that filters out blue and green light to reduce the amount of extraneous light that strikes the sensor. If allowed to strike the sensor, such extraneous light may introduce an error into the determination of the PCLK phase error by the phase detector 58 (FIG. 5).

FIG. 7A shows the relative locations of the pixels in two consecutive horizontal lines 92 and 94 when the pixel clock is in phase with the beam position. More specifically and with reference to FIGS. 5 and 6, the sensor 54 is centered about the horizontal midline 77 and is as wide as two pixels in both the horizontal and vertical dimensions, and the scan region 74 is 900 pixels wide in the horizontal dimension. The mirror 14 sweeps the synchronization beam 50 from left to right to scan the line 92, and then sweeps the beam from right to left to scan the line 94. Because PCLK is in phase with the beam 50, the two center pixels 450 and 451 of each line 92 and 94 are adjacent to and equidistant from the mid line 77, the pixel 450 in the line 92 is vertically aligned with the pixel 450 in the line 94, the pixel 451 in the line 92 is aligned with the pixel 451 in the line 94, and so on.

FIG. 7B, however, shows the relative locations of the pixels in the two consecutive horizontal lines 92 and 94 when the pixel clock lags the beam position by two pixel positions. More specifically and with reference to FIG. 5, because the pixel clock PCLK lags the beam 50 by two pixels, the pixels in the line 92 are effectively shifted two pixels to the right relative to their in-phase positions shown in FIG. 7A, and the pixels in the line 94 are effectively shifted two pixels to the left relative to their in-phase positions also shown in FIG. 7A. Consequently, there is a four-pixel shift in the line 94 relative to the line 92 such that in the line 92 the pixels 448 and 449 are adjacent to and equidistant from the mid line 77, and in the line 94 the pixels 452 and 453 are adjacent to and equidistant from the mid line.

Referring to FIGS. 5, 7A, and 7B, a technique is described for detecting PCLK's two-pixel phase-lag error shown in FIG. 7B and correcting this error so that the pixels in the lines 92 and 94 are aligned as shown in FIG. 7A.

First, the beam controller 52 or another section of the circuit 42 causes the vertical-scan drive circuit (not shown in FIGS. 5, 7A or 7B) to cause the mirror 14 to sweep the beam 50 in the vertical dimension, it being understood that the mirror scans the lines 92 and 94 only once per vertical-sweep cycle.

Next, for each left-to-right sweep of the line 92, the beam controller 52 activates the beam source 48 such that in the line 92 the beam 50 generates a single respective pixel; similarly, for each right-to-left sweep of the line 94, the beam controller activates the beam source such that in the line 94 the beam generates a single respective pixel. The beam 50 generates only a single pixel per each sweep of the lines 92 and 94 so that the sensor 54 detects the intensity of only one pixel at a time as discussed below. The beam controller 52 continues in this manner until the beam 50 generates a predetermined number of the same pixels in each of the lines 92 and 94. For example, the beam controller 52 causes the beam 50 to generate sixteen pixels 443-458 (a subset of which are shown in FIGS. 7A and 7B), one in each of the lines 92 and 94, over sixteen successive (though not necessarily immediately successive) sweeps. That is, each left-to-right sweep contains a single respective pixel in the line 92, and each right-to-left sweep contains a single respective pixel in the line 94. These sixteen pixels include and are centered around the center pixels 450 and 451, because these are the sixteen pixels in each line that are near the sensor 54 when the expected maximum phase error is ±8 pixels. The beam controller 52 may cause the beam 50 to generate these pixels in numerical order, i.e., pixel 443 in line 92 during the first left-to-right sweep of line 92, pixel 443 in line 94 during the first right-to-left sweep of line 94, pixel 444 in line 92 during the second left-to-right sweep of line 92, pixel 444 in line 94 during the second right-to-left sweep of line 94, and so on. Or, the beam controller 52 may cause the beam 50 to generate these pixels in any other order, and may generate these pixels in other than sixteen consecutive sweeps of the line 92 and of the line 94. The beam controller 52 may include a counter (not shown in FIG. 5) to keep track of the pixel number in each line 92 and 94. The signal $H_{sync}$ from the PLL 46 indicates the beginning of the line 92, and thus resets the counter to 1. As the mirror 14 sweeps the beam 50 from left to right across the line 92, the counter increments by one each cycle of PCLK to 900. Then, as the mirror 14 sweeps the beam 50 from right to left across the line 94, the counter decrements by one each cycle of PCLK back to 1.

During the generation of each of the pixels in the lines 92 and 94 per the preceding paragraph, the sensor 54 generates the detection signal DS, which indicates the relative intensity of the generated pixel. For example, referring to FIG. 7B, because the entire pixel 448 in line 92 strikes the sensor 54, the sensor measures a maximum relative intensity for the pixel 448. In contrast, because the pixel 445 in line 92 is three pixels away from the sensor 54, the sensor measures a relatively low, perhaps even zero, intensity for the pixel 445.

Then, the phase detector 58 stores the relative intensities for each of the pixels that the beam 50 generates, and from these intensities determines the phase error between the pixel clock PCLK and the position of the beam.

More specifically, the phase detector 58 first calculates the respective intensity centroids $C_{92}$ and $C_{94}$ for the lines 92 and 94 according to the following equations:

$$C_{92} = \frac{\sum_{n=1}^{PC} P_n \cdot I_{92n}}{\sum_{n=1}^{PC} I_{92n}} \quad (1)$$

$$C_{94} = \frac{\sum_{n=1}^{PC} P_n \cdot I_{94n}}{\sum_{n=1}^{PC} I_{94n}} \quad (2)$$

where PC is the number of pixels (sixteen in the above example) that the beam 50 generates in each line 92 and 94, $P_n$ is the location number (e.g., 450) of the $n^{th}$ pixel, $I_{92n}$ is the measured intensity of the $n^{th}$ pixel in the line 92, and $I_{94}$ is the measured intensity of the $n^{th}$ pixel in the line 94.

Next, the phase detector 58 compares $C_{92}$ to $C_{94}$.

If $C_{92}=C_{94}$, or $C_{92}\approx C_{94}$ (for example, within ±5%), then the phase detector 58 determines that the phase error PE between PCLK and the position of the beam 50 is below a predetermined phase-error threshold (for example a threshold corresponding to $C_{92}-C_{94}$ within ±5% of $$\frac{C_{92} + C_{94}}{2}\Bigg),$$

and thus does not need to be corrected.

If $C_{92}>C_{94}$ such that the PE>the magnitude of the predetermined phase-error threshold (PE positive), then the phase detector 58 determines that the phase of PCLK leads the position of the beam 50, and thus that the phase shifter 60 must retard the phase of PCLK to drive the phase error PE toward or to zero.

In contrast, if $C_{92}<C_{94}$ such that PE<the magnitude of the predetermined phase-error threshold (PE negative), then the phase detector 58 determines that the phase of PCLK lags the position of the beam 50 as shown in FIG. 7B, and thus that the phase shifter 60 must advance the phase of PCLK to drive the phase error PE toward or to zero.

Next, the phase shifter 60 adjusts the phase of PCLK as indicated by the value of PE. If the magnitude of PE is less than the predetermined phase-error threshold, then the phase shifter 60 maintains PCLK at its current phase. If PE is positive, then the phase shifter 60 retards the phase of PCLK by an amount that is proportional to the magnitude of PE. Conversely, if PE is negative, then the phase shifter 60 advances the phase of PCLK by an amount that is proportional to the magnitude of PE. To stabilize the phase-correction loop formed by the circuit 42, the phase shifter 60 may, for each new value of PE received from the phase detector 58, only partially correct the phase of PCLK. This is akin to reducing the gain of a negative feedback loop so that the loop does not oscillate.

If necessary, the circuit 42 repeats the above-described sequence until the phase error PE is less than the predetermined phase-error threshold.

Still referring to FIGS. 5, 7A, and 7B, an example of the above-described technique is provided.

In this example, the pixels of the lines 92 and 94 are aligned as shown in FIG. 7B, the measured intensities of the pixels 448 and 449 in the line 92 and of the pixels 452 and 453 in the line 94 each equal 1, the measured intensities of the pixels 447 and 450 in the line 92 and the pixels 451 and 454 in line 94 equal 0.5, the measured intensities of the pixels 446 and 451 in line 92 and the pixels 450 and 455 in line 94 equal 0.25, and the measured intensities of all other pixels in the lines 92 and 94 equal 0.

Therefore, from equation (1):

$$C_{92} = \frac{446 \cdot 0.25 + 447 \cdot 0.5 + 448 \cdot 1 + 449 \cdot 1 + 450 \cdot 0.5 + 451 \cdot 0.25}{0.25 + 0.5 + 1 + 1 + 0.5 + 0.25} = 514.67$$

and from equation (2):

$$C_{94} = \frac{450 \cdot 0.25 + 451 \cdot 0.5 + 452 \cdot 1 + 453 \cdot 1 + 454 \cdot 0.5 + 455 \cdot 0.25}{0.25 + 0.5 + 1 + 1 + 0.5 + 0.25} = 517.07$$

Because $C_{92} < C_{94}$, the phase detector 58 generates a negative value for PE that is proportional to the difference $C_{94} - C_{92} = 2.4$. Assuming here that the magnitude of PE is greater than the magnitude of the predetermined phase-error threshold, in response to this value of PE, the phase shifter 60 advances the phase of PCLK.

The circuit 42 repeats this procedure as needed to align the pixels of the lines 92 and 94 as shown in FIG. 7A.

Still referring to FIGS. 5, 7A, and 7B, although the above phase-detection-and-correction technique is described where a pixel either fully strikes or fully misses the sensor 54, the technique also works where one or more of the pixels partially strikes the sensor.

Furthermore, this technique also works where the horizontal dimension or the vertical dimension of the sensor 54 is smaller or greater than the width of two pixels.

In addition, instead of generating each pixel only once, the beam controller 52 can generate multiple instances of each pixel, and the phase detector 58 can filter out noise by calculating the intensity of each pixel as the average intensity of the respective multiple pixel instances.

Moreover, the predetermined phase-error threshold may not be symmetrical about zero. That is, the magnitude of the threshold for positive PE may be different than the magnitude of the threshold for negative PE.

Furthermore, this technique works where the sensor 54 is not horizontally centered about the mid line 77, as long as the sensor is within an area covered by the pixels that the beam 50 generates during the execution of this technique. For example, referring to FIG. 7A, suppose that the sensor 54 is shifted to the right such that the horizontal center of the sensor is between the pixels 451 and 452 of the lines 92 and 94 instead of between the pixels 450 and 451 as shown in FIG. 7A. When the circuit 42 operates according to the above-described technique to correct a phase error in PCLK, the circuit still properly adjusts the phase of PCLK so that the pixels 451 of the lines 92 and 94 are vertically aligned on the left side of the sensor 54 and the pixels 452 are vertically aligned on the right side of the sensor 54. And if the sensor 54 is near the edge of or outside of the area covered by the pixels that the beam 50 initially generates, one can typically detect this during testing (for example, because the circuit 42 does not correct the phase error in PCLK) and reprogram the beam controller 52 to generate pixels that are in the area in which the sensor is disposed. Or, one can program the beam controller 52 to generate all of the pixels in each line 92 and 94 so that the phase detector 58 can always detect the phase error in PCLK regardless of the horizontal position of the sensor 54.

Figure 2:
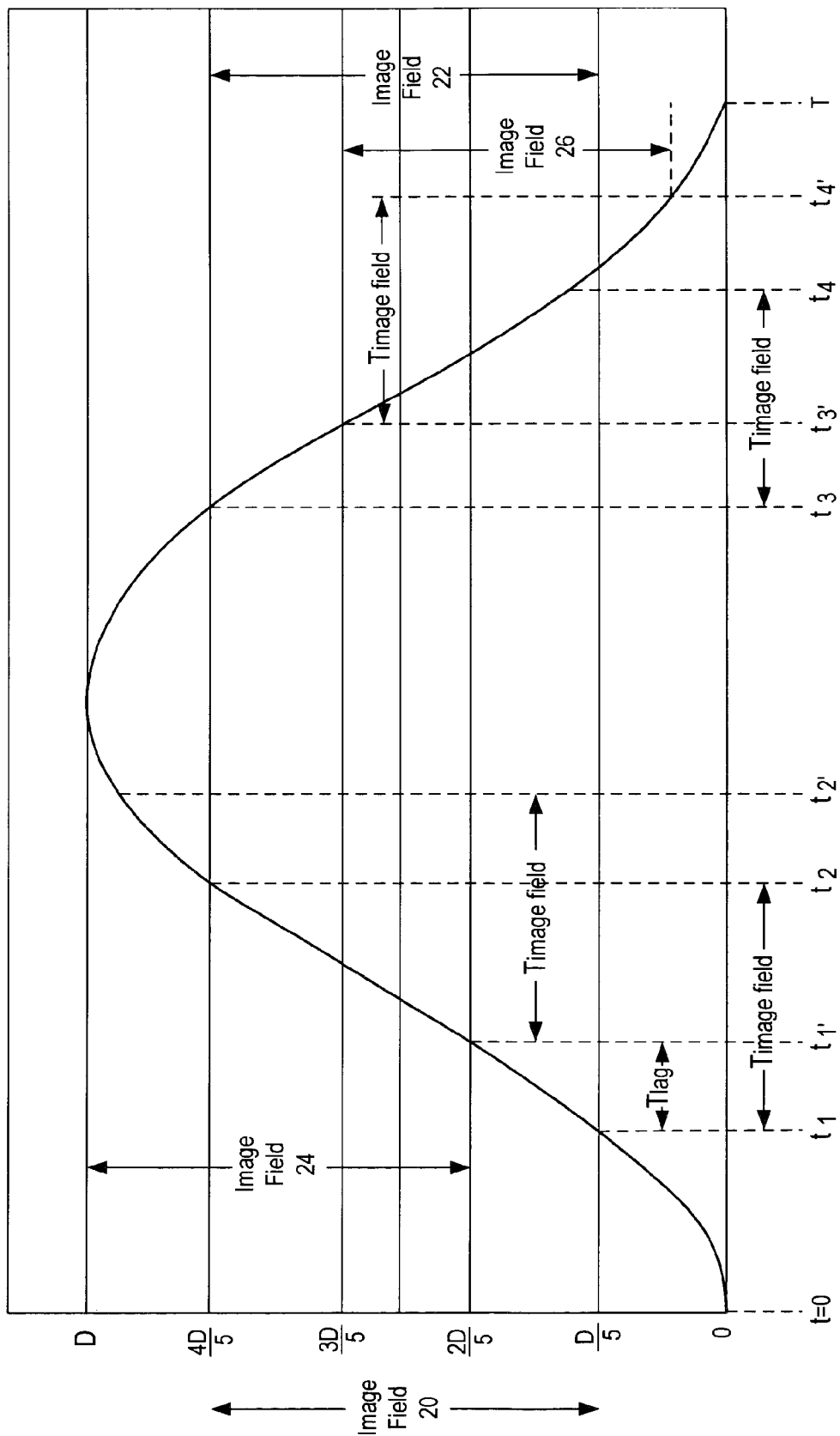
FIG. 2 is a plot of the horizontal position of the swept beam of FIG. 1 versus time, the positions of the left-to-right and right-to-left image fields generated with a pixel clock having zero phase error relative to the beam position, and the positions of the left-to-right and right-to-left image fields generated with a pixel clock having a non-zero phase error.

But although this technique works where the sensor 54 is not horizontally centered about the mid line 77, where the mirror 14 horizontally sweeps the beam in a sinusoidal fashion per FIG. 2, one may prefer that the sensor 54 be horizontally centered (or approximately horizontally centered) about the midline 77 because the midline is where the velocity of the beam 50 is the greatest, and thus where a phase error in PCLK causes the greatest, and thus often the most detectable, spatial horizontal offset between the pixels of the lines 92 and 94.

Referring to FIGS. 5, 7C, and 7D, another technique is described for detecting and correcting a pixel-clock phase error. More specifically, a technique is described for detecting PCLK's partial-pixel phase lead shown in FIG. 7D and correcting this error so that the pixels in the lines 92 and 94 are aligned as shown in FIG. 7A.

FIG. 7C shows the sensor 54 having a horizontal width of one pixel, a vertical height of two pixels, a right edge aligned with the midline 77, and the knife's edge 82a extending through the centers of the pixels 450 in the lines 92 and 94 when the phase error of PCLK is zero.

FIG. 7D shows the positions of the pixels 450 in the lines 92 and 94 relative to the knife's edge 82a when the phase of PCLK leads the position of the beam 50 by a partial pixel.

To detect and correct the phase error in PCLK, the beam controller 52 or another section of the circuit 42 first causes the vertical-scan drive circuit (not shown in FIGS. 5, 7A or 7B) to cause the mirror 14 to sweep the beam 50 in the vertical dimension, it being understood that the mirror scans the lines 92 and 94 only once per vertical-sweep cycle.

Next, during a left-to-right sweep of the line 92, the beam controller 52 activates the beam source 48 such that in the line 92 the beam 50 generates the pixel 450; similarly, for a subsequent right-to-left sweep of the line 94, the beam controller activates the beam source such that in the line 94 the beam generates the pixel 450.

During the generation of each of the pixels 450 in the lines 92 and 94 per the preceding paragraph, the sensor 54 generates the detection signal DS, which indicates the relative intensity of the generated pixel. For example, referring to FIG. 7D, because the portion of the pixel 450 in the line 94 that strikes the sensor 54 is larger than the portion of the pixel 450 in the line 92 that strikes the sensor, the sensor measures a greater intensity for the pixel 450 in the line 94 than it does for the pixel 450 in the line 92.

Then, the phase detector 58 stores the relative intensities for the two pixels 450 that the beam 50 respectively generates in the lines 92 and 94, and from these intensities determines the phase error between PCLK and the position of the beam.

If the measured intensity of the pixel 450 in the line 92 equals or approximately equals (e.g., within ±5%) the measured intensity of the pixel 450 in the line 94, then the phase detector 58 determines that the phase error PE between PCLK and the position of the beam 50 is below a predetermined phase-error threshold, and thus does not need to be corrected.

If the measured intensity of the pixel 450 in the line 92 is greater than the measured intensity of the pixel 450 in the line 94 by more than a predetermined threshold, then the phase detector 58 determines that the phase of PCLK leads the position of the beam 50 (PE positive), and thus that the phase shifter 60 must retard the phase of PCLK to drive the phase error PE toward or to zero.

In contrast, if the measured intensity of the pixel 450 in the line 92 is less than the measured intensity of the pixel 450 in the line 94 by more than a predetermined threshold, then the phase detector 58 determines that the phase of PCLK lags the position of the beam 50 as shown in FIG. 7D (PE negative), and thus that the phase shifter 60 must advance the phase of PCLK to drive the phase error PE toward or to zero.

Next, the phase shifter 60 adjusts the phase of PCLK as indicated by the value of PE in a manner similar to that discussed above in conjunction with FIGS. 7A and 7B. That is, if the magnitude of PE is less than the predetermined phase-error threshold, then the phase shifter 60 maintains PCLK at its current phase. If PE is positive and greater in magnitude than the predetermined threshold, then the phase shifter 60 retards the phase of PCLK by an amount that is proportional to the magnitude of PE. Conversely, if PE is negative and greater in magnitude than the predetermined threshold, then the phase shifter 60 advances the phase of PCLK by an amount that is proportional to the magnitude of PE. To stabilize the phase-correction loop formed by the circuit 42, the phase shifter 60 may, for each new value of PE received from the phase detector 58, only partially correct the phase of PCLK.

If necessary, the circuit 42 repeats the above-described sequence until the magnitude of the phase error PE is less than the predetermined phase-error threshold, and the pixels 450 in the lines 92 and 94 are aligned or approximately aligned as shown in FIG. 7C.

Still referring to FIGS. 5, 7C, and 7D, alternate embodiments of this technique are contemplated.

For example, instead of generating each pixel 450 only once, the beam controller 52 can cause the beam 50 to generate multiple instances each pixel 450, and the phase detector 58 can filter out noise by calculating the intensity of each pixel 450 as the average intensity of the respective multiple pixel instances each pixel to filter out noise.

Moreover, this technique works where the sensor 54 is not near the mid line 77, as long as the knife's edge 82a is aligned with the centers of two of the same pixels in lines 92 and 94 when PCLK has zero phase error. For example, the sensor 54 may be shifted to the right such that the edge 82a is aligned with the centers of the pixels 451 (not shown in FIGS. 7C-7D) instead of with the centers of the pixels 450. If the misalignment of the sensor 54 with the pixels 450 is inadvertent, one can typically determine this during testing of the circuit 42 (for example, the circuit 42 does not correct the phase error in PCLK based on the generation of the pixels 450) and reprogram the beam controller 52 to generate the pixels, e.g., the pixels 451, in the lines 92 and 94 with which the edge 82a is aligned when PCLK has zero phase error. For example, where the edge 82a is aligned with the pixels 451 instead of with the pixels 450 when PCLK has zero phase error, one can add an offset of one pixel to the beam controller 52 such that it generates the pixels 451 in lines 92 and 94 instead of the pixels 450.

But, although this technique works where the sensor 54 is not near the mid line 77, where the mirror 14 horizontally sweeps the beam in a sinusoidal fashion per FIG. 2, one may prefer that the sensor 54 be near the midline because the midline is where the phase error is PCLK may be most detectable for the reason discussed above in conjunction with FIGS. 7A-7B.

Figure 8:
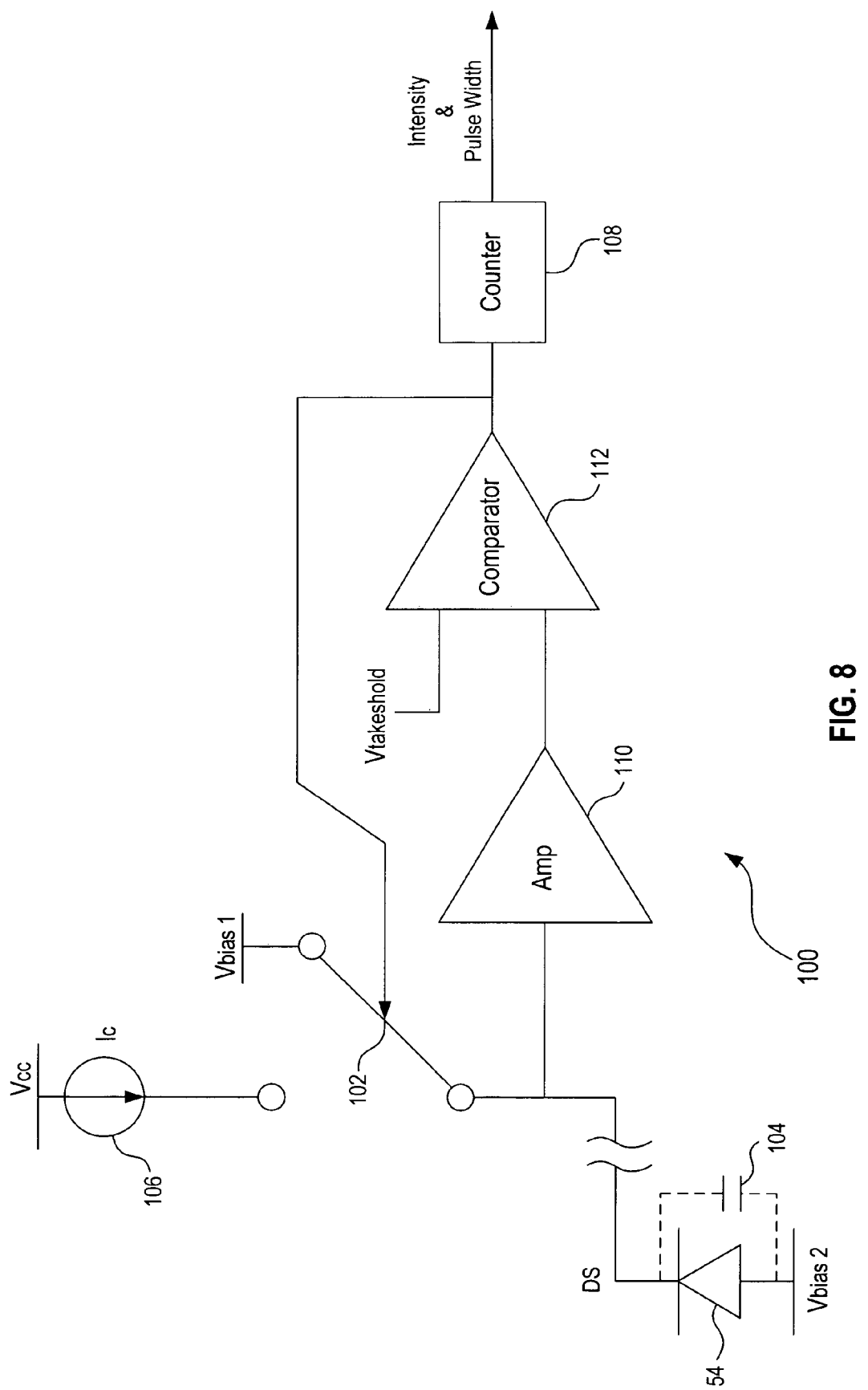
FIG. 8 is a schematic diagram of a circuit for measuring the intensity of a beam portion that strikes the sensor of FIG. 5 according to an embodiment.

FIG. 8 is a schematic diagram of a circuit 100 for measuring the intensity of a pixel that strikes the sensor 54. The circuit 100 may be included within the phase detector 58 of FIG. 5.

Referring to FIGS. 5 and 8, the operation of the circuit 100 is described.

During a period where the beam controller 52 is not generating a pixel with the synchronization beam 50, a switch 102 forces a voltage $V_{bias1} - V_{bias2}$ across the single photo diode that composes the sensor 54, and across a parasitic or actual capacitor 104, which is in parallel with the sensor.

In response to the beam controller 52 activating the beam 50 to generate a pixel, the switch 102 toggles to couple the sensor 54 to a current source 106, which generates a constant current Ic that is greater than the maximum current expected from the sensor. The beam controller 52 may generate a signal (not shown) that causes the switch 102 to toggle as described.

Also in response to the beam controller 52 activating the beam 50, a counter 108 begins counting from a predetermined initial count value such as 0. The counter 108 may receive PCLK or another clock signal as a counting clock.

In response to the beam 50, the sensor 54 sinks a current (the signal DS) having a magnitude that is proportional to the portion of the beam that strikes or that is otherwise detected by the sensor. The current sunk by the sensor 54 and the current Ic combine to charge the capacitor 104. But because the current sunk by the sensor 54 tends to discharge the capacitor 104, the greater this sunk current, the longer it takes the current Ic to charge the capacitor 104. Therefore, it follows that the greater the portion of the beam 50 that the sensor 54 detects, the longer it takes the current Ic to charge the capacitor 104, and vice versa.

An amplifier 110 amplifies the voltage across the capacitor 104 and provides the amplified voltage to a comparator 112.

When the amplified voltage exceeds a predetermined threshold voltage $V_{threshold}$, the output of the comparator 112 toggles, thus stopping the counter and causing the switch 102 to toggle back to the state in which the switch drives a voltage $V_{bias1} - V_{bias2}$ across the sensor 54.

Consequently, the count value represents the measured intensity of the pixel generated by the beam 50. That is, the greater the count value the greater the measured pixel intensity, and the lower the count value the lower the measured pixel intensity.

Still referring to FIG. 8, other embodiments of the circuit 100 may have different topologies, and may also include more or fewer components.

Figure 9:
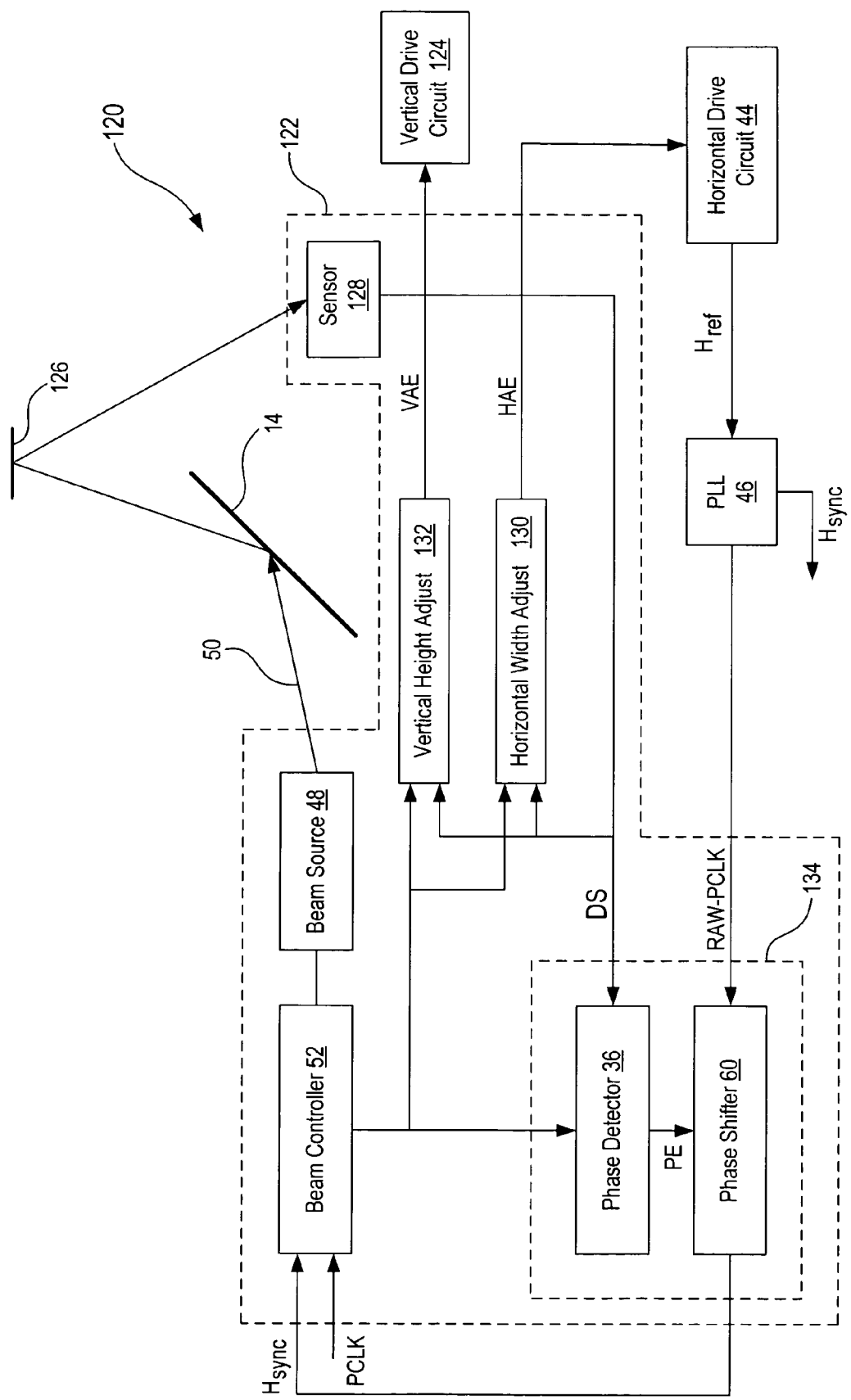
FIG. 9 is a block diagram of a scanned-image subsystem that includes a circuit for detecting and correcting a phase error in a pixel clock and for adjusting the widths and heights of a scan region and of an image frame according to an embodiment.

FIG. 9 is a block diagram of a scanned-image subsystem 120, which includes a circuit 122 for detecting and correcting a phase error in a pixel clock PCLK, for adjusting the respective horizontal widths D and W of a scan region and the image frame within the scan region, and for adjusting the respective vertical heights V and H of the scan region and image frame.

Therefore, in addition to automatically correcting a phase error in PCLK, the circuit 122 also corrects errors in the height and width of the image frame. Furthermore, because the subsystem 120 includes components common to the subsystem 40 of FIG. 5, these components have the same reference numbers in both FIGS. 5 and 9.

Like the subsystem 40 of FIG. 5, the subsystem 120 includes the MEMS mirror 14, the horizontal-scan drive circuit 44 for causing the mirror to rotate back and forth in the horizontal dimension, the phase-locked-loop (PLL) circuit 46 for generating signals RAW_PCLK and $H_{sync}$ from the signal $H_{ref}$, and a vertical-scan drive circuit 124 (not shown in FIG. 5) for causing the mirror 14 to rotate back and forth in the vertical dimension.

But unlike the subsystem 40, the subsystem 120 also includes a reflector 126 for directing the synchronization beam 50 to a sensor 128, which is further discussed below. The reflector 126 allows one to mount the sensor 128 behind the mirror 14 instead of on the mask 62 (FIG. 5) or otherwise in front of the mirror, although one may omit the reflector and mount the sensor 128 to the mask 62 or otherwise in front of the mirror.

Furthermore, like the circuit 42 of FIG. 5, the circuit 122 includes the beam source 48 for generating the synchronization beam 50 and includes the beam-source controller 52.

But unlike the circuit 42, the circuit 122 includes the sensor 128, a horizontal-width adjuster 130, a vertical-height adjuster 132, and a phase corrector 134, which includes a phase detector 136 and the phase shifter 60. Unlike the sensor 54 (FIG. 5), which includes a single sensing region, the sensor 128 includes multiple sensing regions, and generates multiple corresponding detection signals DS. Furthermore, as discussed below in conjunction with FIG. 10, the sensor 128 is positioned away from the horizontal center of the scan region within an upper or lower border region. Like the phase detector 56 (FIG. 5), the phase detector 136 determines from the detection signals DS a phase error PE in PCLK relative to the position of the synchronization beam 50; but as discussed below, the phase detector 136 makes this determination differently than the phase detector 56 does as discussed above in conjunction with FIGS. 7A-7D. And the adjusters 130 and 132 respectively detect and correct errors in the horizontal width D and the vertical height V of a scan region (FIG. 10) in response to the signals DS from the sensor 128. Of course for an image frame of given pixel dimensions, detecting and correcting errors in D and V inherently detects and corrects errors in the width W and height H of the image frame within the scan region.

Figure 10:
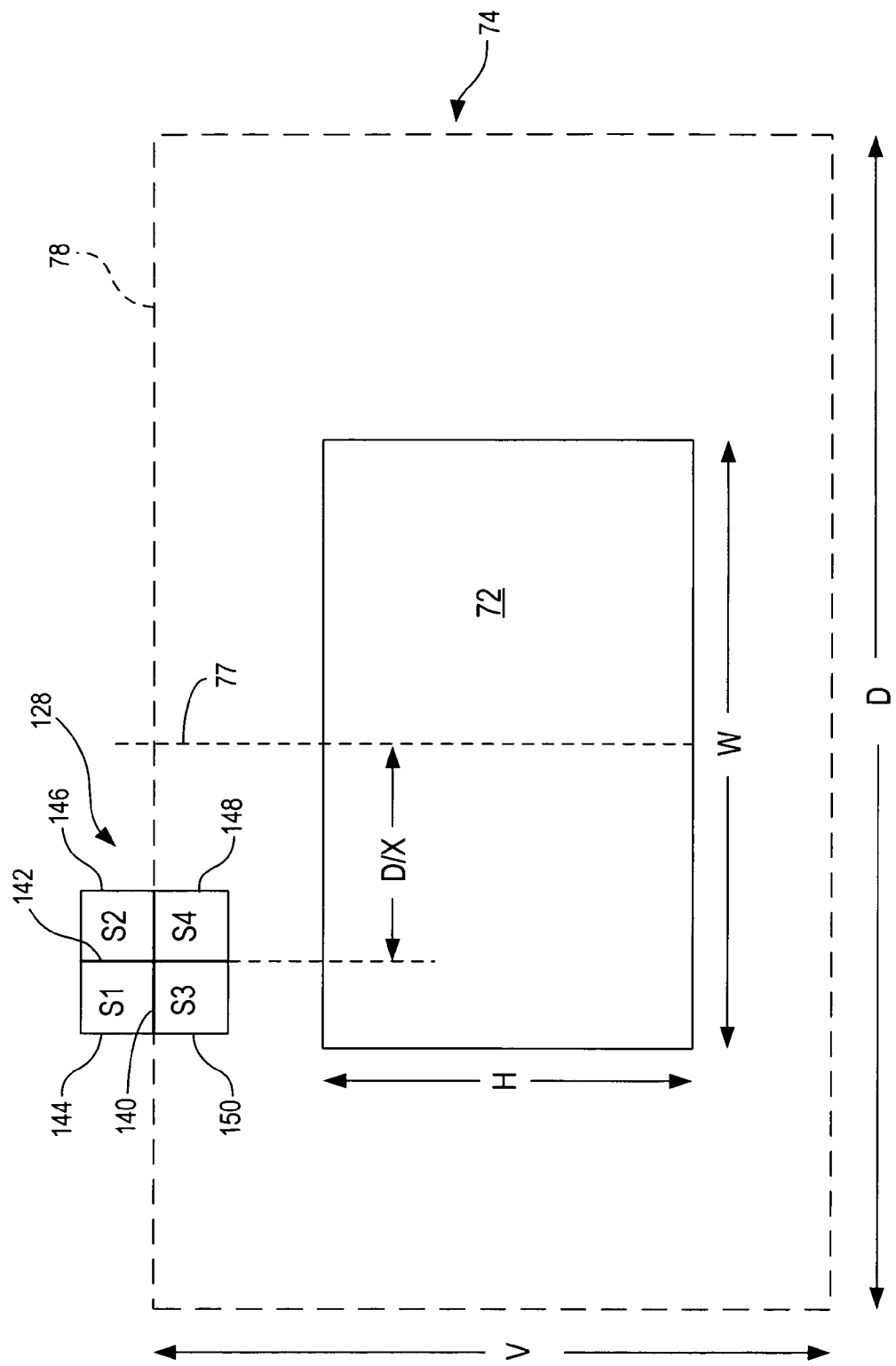
FIG. 10 is a plan view of a scan region, an image frame within the scan region, and a position of the sensor of FIG. 9 relative to the scan region according to an embodiment.

FIG. 10 is a diagram showing an example of the virtual position of the sensor 128 of FIG. 9. Because this diagram includes features common to the diagram of FIG. 6, these features have the same reference numbers in both FIGS. 6 and 10. More specifically, the virtual position of the sensor 128 is the position of the sensor relative to the image frame 72 and the scan region 74 scanned by the mirror 14 (FIG. 5). That is, although the sensor 128 may be mounted behind the mirror 14, the reflector 126 (FIG. 9) is positioned such that the virtual position of the sensor 128 is as shown, with the center of the sensor a distance D/x from the midline 77 of the scan region 74.

In the embodiment of FIG. 10, the sensor 128 includes four sensing regions S1, S2, S3, and S4, which are arranged as square quadrants. A respective photo diode may compose each of these regions, which are contiguous along straight horizontal and vertical boundaries 140 and 142. These boundaries are similar to the knife's edges 82a and 82b of FIG. 6. The sensor 128 also has outer edges 144, 146, 148, and 150, which are also straight and similar to the knife's edges 82a and 82b. Alternatively, a cover similar to the cover 80 (FIG. 6) may be placed over the sensor 128 to define the boundaries 140 and 142 and/or the edges 144-150.

Referring to FIGS. 9-10, in an embodiment where the circuit 122 uses the sensor 128 only to adjust the vertical height V of the scan region 74, the sensing regions S1 and S2 may be combined into a single top sensing region, and the regions S3 and S4 may be combined into a single bottom sensing region such that the sensor has only top and bottom rectangular sensing regions contiguous along the horizontal boundary 140. That is, the vertical boundary 142 does not exist.

Conversely, in an embodiment where the circuit 122 (FIG. 9) does not use the sensor 128 to adjust the vertical height V of the scan region 74, the sensing regions S1 and S3 may be combined into a single left sensing region, and the regions S2 and S4 may be combined into a single right sensing region such that the sensor has only left and right rectangular sensing regions contiguous along the vertical boundary 142. That is, the horizontal boundary 140 does not exist.

Still referring to FIGS. 9-10, the different embodiments of the sensor 128 and the value of x are further discussed below in conjunction with FIGS. 11A-15. Moreover, because the sensor 128 has multiple sensing regions S, each of the horizontal-width adjuster 130, vertical height adjuster 132, and the phase detector 136 may include a respective circuit such as the circuit 100 (FIG. 8) for each sensing region S to convert the signal DS from that region S into a respective intensity value. For example, the phase detector 136 may include four circuits 100, one for each of the sensing regions S1-S4.

Figure 11B:
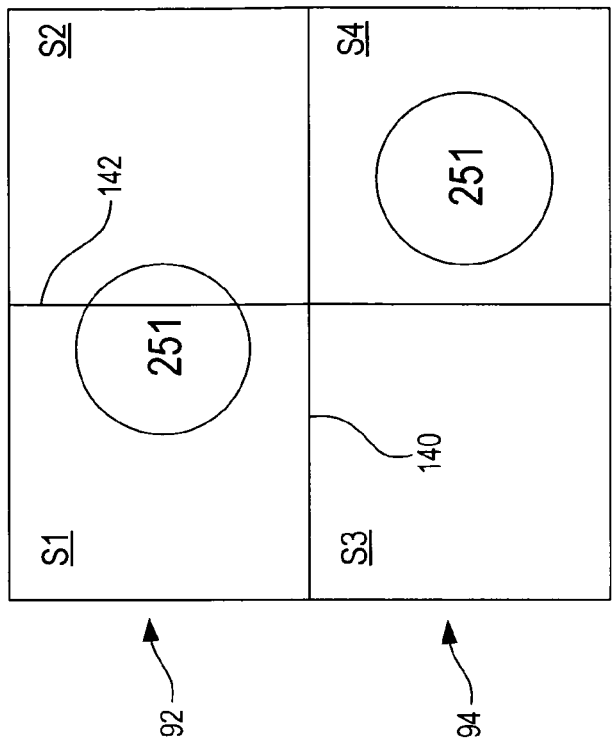
FIGS. 11A-11B illustrate a technique for determining and correcting the phase error of the pixel clock of FIG. 9 according to an embodiment.
Figure 11A:
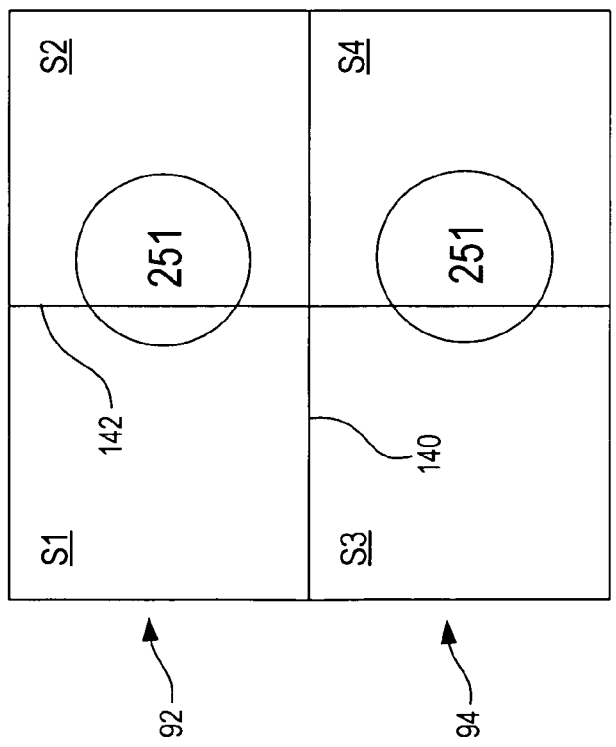

FIG. 11A shows the sensor 128 having a horizontal width of two pixels and a vertical height of two pixels (i.e., each sensing region S has the dimensions of a pixel), having the horizontal boundary 140 located between the pixels 251 in the horizontal lines 92 and 94, and having the vertical boundary 142 extending through the left sides of the pixels 251 in the lines 92 and 94 when the phase error of PCLK (FIG. 9) equals 0.

FIG. 11B shows the positions of the pixels 251 in the lines 92 and 94 relative to the boundary 142 when the phase of PCLK (FIG. 9) leads the position of the beam 50 (FIG. 9) by a partial pixel.

Referring to FIGS. 9, 10, 11A, and 11B, a technique that the circuit 122 may implement for detecting and correcting a pixel-clock phase error is described. As a specific example, the technique is described for detecting PCLK's partial-pixel phase-lead error shown in FIG. 11B and correcting this error so that the pixels 251 in the lines 92 and 94 are aligned as shown in FIG. 11A. This technique is similar to the technique that the circuit 42 (FIG. 5) may implement to detect and correct the PCLK phase error as discussed above in conjunction with FIGS. 7C and 7D.

First, the beam controller 52 or another section of the circuit 122 causes the vertical-scan drive 124 to cause the mirror 14 to sweep the beam 50 in the vertical dimension.

Next, during a left-to-right scan of the line 92, the beam controller 52 activates the beam source 48 such that in the line 92 the beam 50 generates the pixel 251; similarly, for a subsequent right-to-left scan of the line 94, the beam controller activates the beam source such that in the line 94 the beam generates the pixel 251.

During the generation of each of the pixels 251 in the lines 92 and 94 per the preceding paragraph, the sensor 128 generates one respective detection signal DS for each sensing region S1-S4, and these signals DS1-DS4 indicate the relative intensity of the portion of the generated pixel that strikes or is otherwise detected by the corresponding sensing region. For example, referring to FIG. 11B, because the portion of the pixel 251 in the line 92 that strikes the sensing region S1 is larger than the portion of the pixel 251 in the line 92 that strikes the sensing region S2, the sensing region S1 measures a greater intensity for the pixel 251 in the line 92 than the sensing region S2 does.

Then, for each of the sensing regions S1-S4, the phase detector 136 stores the relative intensities for each of the pixels 251 that the beam 50 respectively generates in the lines 92 and 94, and from these intensities determines the phase error between PCLK and the position of the beam.

Generally, where the pixel 251 in the line 92 is vertically aligned with the pixel 251 in the line 94, the phase error equals zero. With specific reference to the sensor 128, where the portion of the pixel 251 in the line 92 on the left side of the boundary 142 equals the portion of the pixel 251 in the line 94 on the left side of the boundary 142, and the portion of the pixel 251 in the line 92 on the right side of the boundary 142 equals the portion of the pixel 251 in the line 94 on the right side of the boundary 142, the phase error is zero.

Therefore, for each pixel 251, the phase detector 136 next computes a position-dependent intensity value PDI according to the following equations:

$$PDI_{92}=[(DS1_{92}+DS3_{92})-(DS2_{92}+DS4_{92})]/(DS1_{92}+DS2_{92}+DS3_{92}+DS4_{92}) \quad (3)$$

$$PDI_{94}=[(DS1_{94}+DS3_{94})-(DS2_{94}+DS4_{94})]/(DS1_{94}+DS2_{94}+DS3_{94}+DS4_{94}) \quad (4)$$

where $PDI_{92}$ is the position-dependent intensity value for the pixel 251 in the line 92, $DS1_{92}$-$DS4_{92}$ are the respective intensity measurements from the regions S1-S4 of the sensor 128 for the pixel 251 in the line 92, $PDI_{94}$ is the position-dependent intensity value for the pixel 251 in the line 94, and $DS1_{94}$-$DS4_{94}$ are the respective intensity measurements from the regions S1-S4 of the sensor for the pixel 251 in the line 94.

Next, the phase detector 136 compares $PDI_{92}$ to $PDI_{94}$.

If $PDI_{92}$ equals or approximately equals $PDI_{94}$ (for example, within a predetermined threshold of ±5%), then the phase detector 136 determines that the phase error PE between PCLK and the position of the beam 50 is below a predetermined phase-error threshold, and thus that PE does not need to be corrected.

If $PDI_{92}<PDI_{94}$ by more than the magnitude of a predetermined threshold, then the phase detector 136 determines that the phase of PCLK lags the position of the beam 50 (PE negative), and thus that the phase shifter 60 must advance the phase of PCLK to drive the phase error PE toward or to zero.

In contrast, if $PDI_{92}>PDI_{94}$ by more than the magnitude of a predetermined threshold, then the phase detector 136 determines that the phase of PCLK leads the position of the beam 50 as shown in FIG. 11B (PE positive), and thus that the phase shifter 60 must retard the phase of PCLK to drive the phase error PE toward or to zero.

Next, the phase shifter 60 adjusts the phase of PCLK as indicated by the calculated value of PE in a manner similar to that discussed above in conjunction with FIGS. 7A-7D. That is, if the magnitude of PE is less than the predetermined phase-error threshold, then the phase shifter 60 maintains PCLK at its current phase. If PE is positive and greater in magnitude than the predetermined threshold, then the phase shifter 60 retards the phase of PCLK by an amount that is proportional to the magnitude of PE. Conversely, if PE is negative and greater in magnitude than the predetermined threshold, then the phase shifter 60 advances the phase of PCLK by an amount that is proportional to the magnitude of PE. To stabilize the phase-correction loop formed by the circuit 122, the phase shifter 60 may, for each new value of PE received from the phase detector 136, only partially correct the phase of PCLK.

If necessary, the circuit 122 repeats the above-described sequence until the phase error PE is less than the predetermined phase-error threshold, and the pixels 251 in the lines 92 and 94 are aligned or approximately aligned as shown in FIG. 11A.

Still referring to FIGS. 9, 11A, and 11B, alternate embodiments of this technique are contemplated.

For example, instead of generating each pixel 251 only once, the beam controller 52 can cause the beam 50 to generate multiple instances of each pixel 251, and the phase detector 136 can filter out noise by calculating the intensity of each pixel 251 as the average intensity of the respective multiple pixel instances.

Furthermore, although discussed in conjunction with the pixels 251 in the lines 92 and 94, this technique works with any other pixels with which the sensor 128 is aligned, and regardless of where the vertical boundary 142 bisects the pixels when the phase error of PCLK is zero.

In addition, because the horizontal boundary 140 of the sensor 128 is not used in the above-described technique for determining the phase error in PCLK, instead of including four sensing regions S1-S4, the sensor may include only two sensing regions (left and right) and thus omit the boundary 140 as discussed above in conjunction with FIG. 10.

Referring to FIGS. 9, 10, 12, 13, and 14, next is described a technique that the circuit 122 may use for both detecting and correcting the phase error of PCLK and detecting and correcting an error in the width D of the scan region 74.

Figure 12:
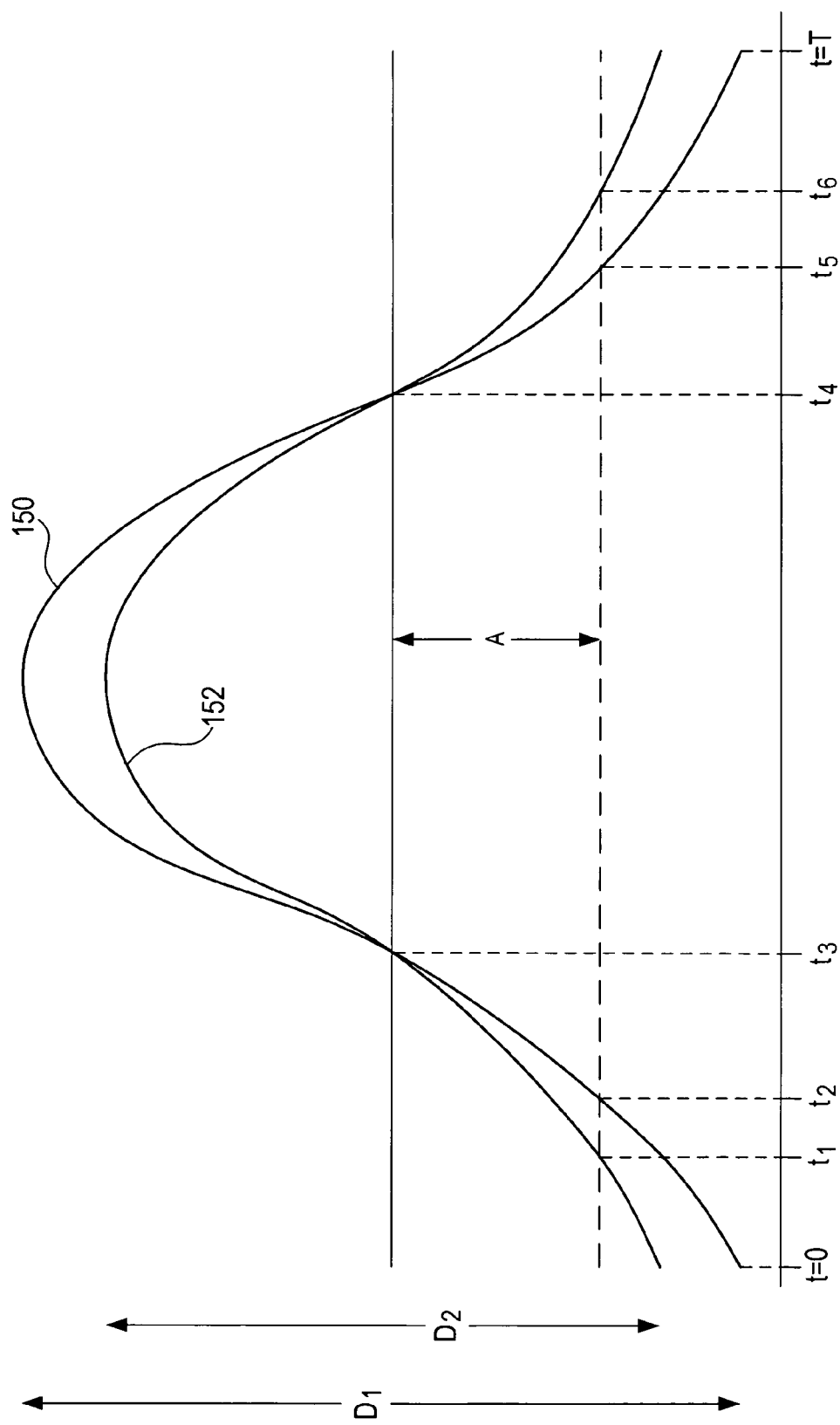
FIG. 12 is a plot of the horizontal position of the swept beam of FIG. 9 versus time over one sweep period for two different scan distances D1 and D2 relative to a reference distance A according to an embodiment.

FIG. 12 shows two plots 150 and 152 of the sinusoidally swept synchronization beam 50 (FIG. 9) versus time for respective widths $D_1$ and $D_2$ of the scan region 74 (FIG. 10).

One can see that although the plots 150 and 152 have the same period T and cross zero at the same times $t_3$ and $t_4$, these plots have an arbitrary amplitude $-A$ at different times $t_2$ and $t_5$, and $t_1$ and $t_6$, respectively—although A is shown as a negative value relative to the zero-crossing, it may be a positive value. More specifically, the plot 150, which corresponds to the larger width $D_1$ and which thus has the larger amplitude, first crosses $-A$ at $t_2$, and then crosses $-A$ again at $t_5$. Times $t_2$ and $t_5$ are symmetrical; that is, the time between $t_0$ and $t_2$ ($t_2-t_0$) equals the time between $t_5$ and T ($T-t_5$). In contrast, the plot 152, which corresponds to the smaller width $D_2$ and which thus has the smaller amplitude, first crosses A at $t_1$, which is before $t_2$, and then crosses A again at $t_6$, which is after $t_5$. Like the times $t_1$ and $t_5$, the times $t_1$ and $t_6$ are symmetrical; that is, the time between $t_0$ and $t_1$ ($t_1-t_0$) equals the time between $t_6$ and T ($T-t_6$).

Based on the analysis in the preceding paragraph, one can generally state that a plot of the beam position over a scan region of any width $D_n$, where $D_n/2 \geq A$, crosses $-A$ at a unique pair of symmetrical times $t_a$ and $t_b$.

Consequently, if the circuit 122 (FIG. 9) "knows" the values of A, $t_a$, and $t_b$ for a given width D of the scan region 74 (FIG. 10) and the sensor 128 (FIG. 10) is located at the amplitude A or $-A$, then the circuit 122 can detect and correct for an error in D as discussed below.

Figure 13:
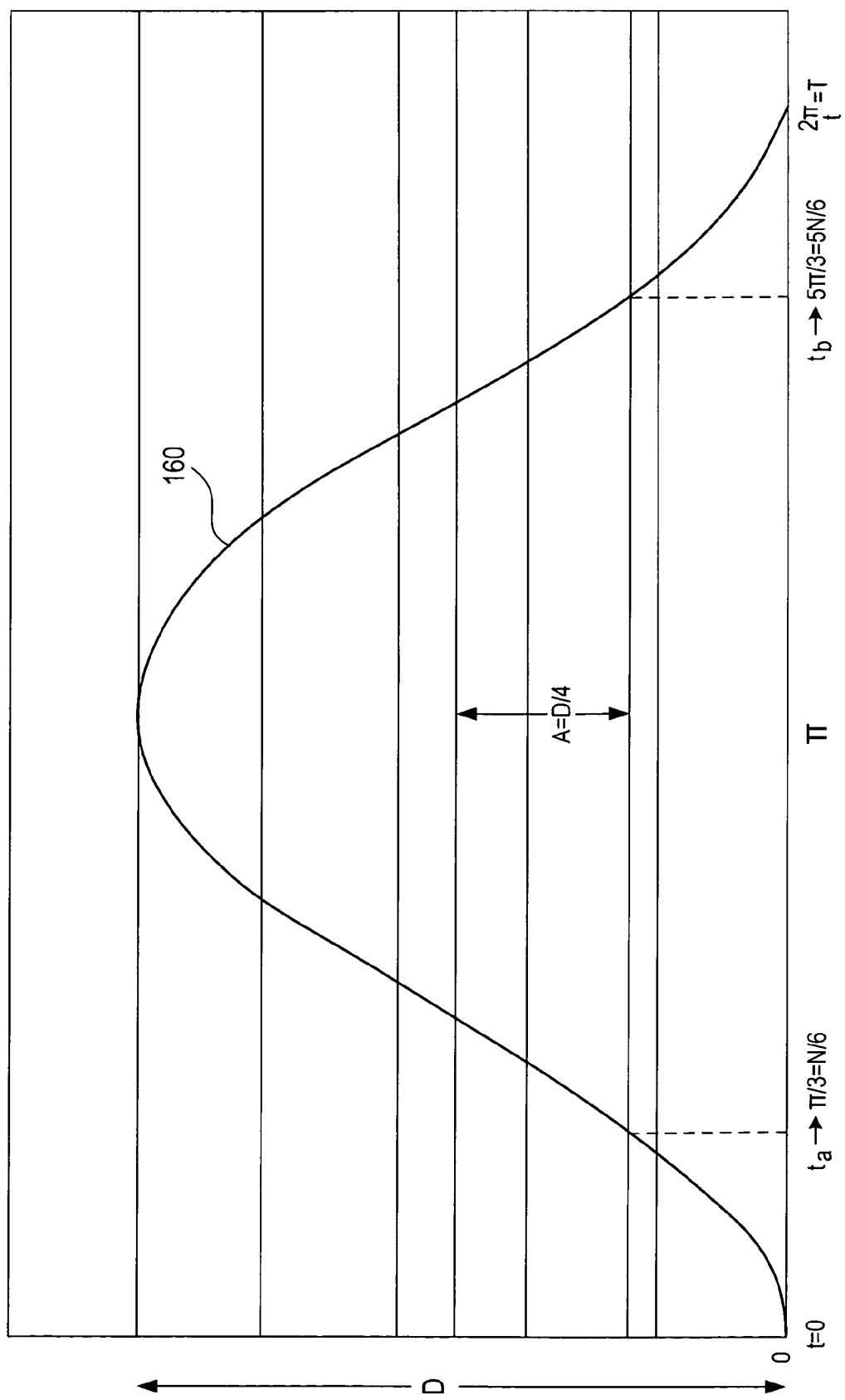
FIG. 13 is a plot of the horizontal position of the swept beam of FIG. 9 versus time over one sweep period and the relative position of the sensor of FIG. 10 according to an embodiment.

FIG. 13 is a plot 160 of the sinusoidally swept synchronization beam 50 (FIG. 9) versus the angular equivalent of time for the scan region 74 (FIG. 10) having a width D and for an amplitude $-A=-D/4$ (x=4 in FIG. 10). As is known, for a periodic function such as the sinusoidal plot 160, t=0 is equivalent to 0 radians, and t=T is equivalent to $2\pi$ radians.

Also known is that the plot 160 crosses −A =−D/4 at π/3 radians and 5π/3 radians. And where N is the number of pixels in a horizontal line of width D, π/3 radians is equivalent to pixel N/6, and 5π/3 radians is equivalent to pixel 5N/6. Consequently, referring to FIG. 10, if the vertical boundary 142 of the sensor 128 is placed a distance D/4 from the midline 77 of the scan region 74 (the midline 77 corresponds to the zero crossings of the plot 160), then the circuit 122 (FIG. 9) can detect and correct for an error in the width D, and thus can set the width D to a desired value as discussed below.

Figure 14:
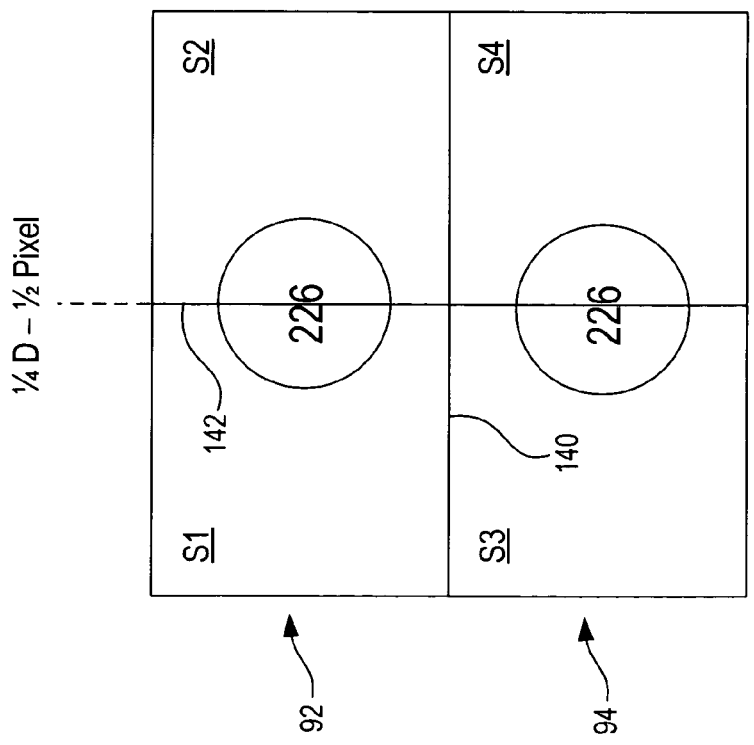
FIG. 14 illustrates a technique for determining and correcting an error in the scan distance D of a scan region generated by the subsystem of FIG. 9 according to an embodiment.

FIG. 14 is a plan view of the sensor 128 and of the pixels 226 in the horizontal lines 92 and 94 aligned in a manner that indicates that the phase error of PCLK is zero, and that the horizontal amplitude error (HAE) of the width D of the scan region 74 (FIG. 10) is also zero. In this example, the number of pixels N in each of the lines 92 and 94 of the scan region 74 is 900, and the vertical boundary 142 of the sensor 128 is actually shifted to the right of D/4 by ½ pixel. The reason for this is that 900/4=225, so D/4 is actually between the pixels 225 and 226 when the phase error of PCLK is zero. But because in this example it is desired to have the boundary 142 bisect the pixels 226 through their centers, the sensor 128 is shifted to the right as indicated; alternatively, the sensor 128 may be shifted to the left such that the boundary 142 bisects the centers of the pixels 225 (not shown in FIG. 14). Or the vertical boundary 142 of the sensor 128 may be aligned with D/4. Although this latter alignment may cause an error in the width D, this error may be tolerable depending on the application.

Referring to FIGS. 9, 10, 13, and 14, the technique for using the circuit 122 for both setting the phase error of PCLK to zero and setting of the width D of the scan region 74 to zero is described in detail. This technique is similar, but not identical, to the technique for setting phase error of PCLK to zero as described above in conjunction with FIGS. 11A and 11B.

First, the circuit 122 sets the phase error of PCLK to zero as discussed above in conjunction with FIGS. 11A and 11B. Therefore, similar to the pixels 251 in FIG. 11A, the pixels 226 of the horizontal lines 92 and 94 are vertically aligned, but it is unknown whether the boundary 142 is aligned with the centers of the pixels 226. If at first the sensor 128 cannot detect the pixels 226, then the horizontal amplitude error of the width D may be so large that no portions of the pixels 226 strike the sensor 128. To remedy this, either a human operator (not shown) or the horizontal-width adjuster 130 may cause the horizontal drive circuit 44 to vary D until the sensor 128 detects the pixels 226.

Next, during a left-to-right scan of the line 92, the beam controller 52 activates the beam source 48 such that the beam generates the pixel 226 in the line 92; similarly, for a subsequent right-to-left scan of the line 94, the beam controller activates the beam source such that the beam generates the pixel 226. in the line 94

Then, during the generation of each of the pixels 226 in the lines 92 and 94 per the preceding paragraph, each sensing region S1-S4 of the sensor 128 generates a respective detection signal DS1-DS4 as discussed above in conjunction with FIGS. 11A and 11B.

Next, for each of the sensing regions S1-S4, the horizontal-width adjuster 130 stores the relative intensities for each of the pixels 226 that the beam 50 generates, and from these intensities determines the horizontal amplitude error of the width D.

Generally, where the pixel 226 in the line 92 is vertically aligned with the pixel 226 in the line 94, and both of these pixels 226 are horizontally centered about the sensor boundary 142, then the horizontal amplitude error of D is zero. With reference to the sensor 128, where the portion of the pixel 226 in line 92 on the left side of the boundary 142 equals the portion of the same pixel 226 on the right side of the boundary 142, and the portion of the pixel 226 in line 94 on the left side of the boundary 142 equals the portion of the same pixel 226 on the right side of the boundary 142, the horizontal amplitude error of D is zero.

Therefore, for the pixels 226 in the lines 72 and 94, the horizontal-width adjuster 130 next computes respective position-dependent intensity values PDI according to equations (3) and (4) above.

If $PDI_{92}$ and $PDI_{94}$ both equal zero or approximately zero, then the horizontal width adjuster 130 determines that the horizontal amplitude error in the width D of the scan region 74 is less than a predetermined error threshold, and thus determines that D needs no adjustment.

If $PDI_{92}$ and $PDI_{94}$ are both positive and greater than a magnitude of a predetermined threshold (the centers of the pixels 226 are both shifted to the left of the boundary 142), then the horizontal width adjuster 130 determines that the width D of the scan region 74 is wider than the predetermined desired width (HAE is positive), and thus that the horizontal drive circuit 44 must reduce the driving force imparted to the mirror 14 to drive the horizontal amplitude error toward or to zero.

In contrast, if $PDI_{92}$ and $PDI_{94}$ are both negative and greater than a magnitude of a predetermined threshold, (the centers of the pixels 226 are both shifted to the right of the boundary 142), then the horizontal-width adjuster 130 determines that the width D of the scan region 74 is narrower than the predetermined desired width (HAE is negative), and thus that the horizontal drive circuit 44 must increase the driving force imparted to the mirror 14 to drive the horizontal amplitude error toward or to zero.

Next, the horizontal drive circuit 44 adjusts the width D as indicated by the calculated value of HAE. That is, if the magnitude of HAE is less than the magnitude of a predetermined amplitude-error threshold, then the drive circuit 44 maintains D at its current width. If HAE is positive and greater than the magnitude of the predetermined threshold, then the drive circuit 44 reduces the width D by an amount that is proportional to the magnitude of HAE. Conversely, if HAE is negative and greater than the magnitude of the predetermined threshold, then the drive circuit 44 increases the width D an amount that is proportional to the magnitude of HAE. To stabilize the scan-width-correction loop formed by the circuit 122, the drive circuit 44 may, for each new value of HAE received from the horizontal width adjuster 130, only partially correct the width D.

If necessary, the circuit 122 repeats the above-described sequence until the both the phase error PE and the horizontal amplitude error HAE are less than their respective predetermined thresholds such that the pixels 226 in the lines 92 and 94 are centered or approximately centered about the boundary 142 as shown in FIG. 14.

Still referring to FIGS. 9, 10, and 14, alternate embodiments of this technique are contemplated.

For example, instead of generating each pixel 226 in the lines 92 and 94 only once, the beam controller 52 can generate multiple instances of each pixel 226, and the horizontal-width adjuster 130 can filter out noise by calculating the intensities of the pixels 226 in the lines 92 and 94 equal to the average intensities of the respective multiple pixel instances.

Furthermore, although discussed in conjunction with the pixels 226 in the lines 92 and 94 where A=D/4, this technique works with any other nonzero value of A.

In addition, because the horizontal boundary 140 of the sensor 128 is not used in the above-described technique for determining the phase error in PCLK and the horizontal amplitude error in the width D, instead of including four sensing regions S1-S4, the sensor may include only two sensing regions (left and right) and thus omit the boundary 140 as discussed above in conjunction with FIG. 10.

Moreover, instead of calculating the values of $PDI_{92}$ and $PDI_{94}$ per equations (3) and (4), the horizontal-width adjuster 130 may calculate only the numerators of these values. The reason for this is that because these values are not compared to one another, the adjuster 130 need not normalize them.

Figure 15:
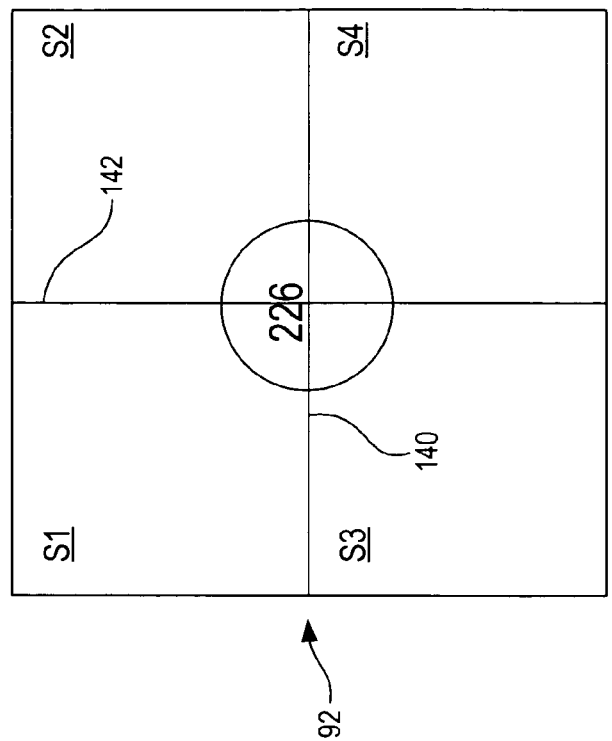
FIG. 15 illustrates a technique for determining and correcting an error in the vertical height V of a scan region generated by the subsystem of FIG. 9 according to an embodiment.

Referring to FIGS. 9, 10, and 15, next is described a technique that the circuit 122 may use for detecting and correcting a vertical amplitude error (VAE) in the height H of the scan region 74.

FIG. 15 is a plan view of the sensor 128 and of a pixel 226 in the horizontal line 92 aligned in a manner that indicates that the phase error of PCLK is zero, that the horizontal amplitude error in the width D of the scan region 74 (FIG. 10) is zero, and that the vertical amplitude error in the height V of the scan region is also zero. In this example, the number of pixels N in the line 92 is 900, and the vertical boundary 142 of the sensor 128 is actually shifted to the right of D/4 by ½ pixel as discussed above in conjunction with FIG. 14.

First, the circuit 122 sets both the phase error of PCLK and the horizontal amplitude error in the width D to zero as discussed above in conjunction with FIGS. 11A, 11B, and 14.

Next, during a left-to-right scan of the line 92, the beam controller 52 activates the beam source 48 such that the beam generates the pixel 226 in the line 92.

Then, during the generation of the pixel 226 in the line 92 per the preceding paragraph, each region S1-S4 of the sensor 128 generates a respective detection signal DS1-DS4 as discussed above in conjunction with FIGS. 11A and 11B.

Next, for each of the sensing regions S1-S4, the vertical-height adjuster 132 stores the relative intensities for the pixel 226 that the beam 50 generates, and from these intensities determines the vertical amplitude error VAE in the height V.

Generally, where the pixel 226 is vertically centered about the horizontal boundary 140 (as shown in FIG. 15), then VAE is zero, and V has the desired predetermined value. With reference to the sensor 128, where the portion of the pixel 226 in the line 92 on the top side of the boundary 140 equals the portion of the same pixel 226 on the bottom side of the boundary 140, VAE is zero.

Therefore, for the pixel 226 in the line 92, the vertical-width adjuster 132 next computes a vertical position-dependent intensity value PDIV according to the following equation:

$$PDIV_{92}=[(S1_{92}+S2_{92})-(S3_{92}+S4_{92})] \quad (5)$$

If $PDIV_{92}$ equals zero or approximately zero, then the vertical-width adjuster 132 determines that the vertical amplitude error in the height V of the scan region 74 is less than a predetermined error threshold, and thus determines that V needs no adjustment.

If $PDIV_{92}$ is positive and greater than a magnitude of a predetermined error threshold, (the center of the pixel 226 is above the boundary 140), then the vertical-height adjuster 132 determines that the height V of the scan region 74 is greater than a predetermined desired height, and thus that the vertical drive circuit 124 must reduce the driving force imparted to the mirror 14 to drive the vertical amplitude error VAE toward or to zero.

In contrast, if $PDIV_{92}$ is negative and greater than a magnitude of a predetermined error threshold (the center of the pixel 226 is below the boundary 140), then the vertical-height adjuster 132 determines that the height V of the scan region 74 is smaller than a predetermined desired height, and thus that the vertical drive circuit 124 must increase the driving force imparted to the mirror 14 to drive the vertical amplitude error VAE toward or to zero.

Next, the vertical drive circuit 124 adjusts the value of V as indicated by the calculated value of VAE. That is, if the magnitude of VAE is less than the predetermined amplitude-error threshold, then the drive circuit 124 maintains V at its current value. If VAE is positive and greater than the magnitude of a predetermined threshold, then the drive circuit 124 reduces the height V by an amount that is proportional to the magnitude of VAE. Conversely, if VAE is negative and greater than the magnitude of a predetermined threshold, then the drive circuit 124 increases the height V an amount that is proportional to the magnitude of VAE. To stabilize the scan-height-correction loop formed by the circuit 122, the drive circuit 124 may, for each new value of VAE received from the vertical height adjuster 132, only partially correct the height V.

If necessary, the circuit 122 repeats the above-described sequence until the magnitude of the vertical amplitude error VAE is less than a predetermined threshold such that the pixel 226 in the line 92 is centered or approximately centered about the horizontal sensor boundary 140 as shown in FIG. 15.

Still referring to FIGS. 9, 10, and 15, alternate embodiments of this technique are contemplated.

For example, instead of generating the pixel 226 in the line 92 only once, the beam controller 52 can generate multiple instances of the pixel 226, and the vertical-height adjuster 132 can filter out noise by calculating the intensity of the pixel 226 as the average intensity of the multiple pixel instances.

Furthermore, although discussed in conjunction with the pixel 226 in the line 92, this technique works with any other pixel and line position. That is, the line 92 need not be the top-most line of the scan region 74, but can be any line between the top of the image frame 72 and the top of the scan region. Furthermore, the pixel can be any pixel within the line 92 that strikes the sensor 128.

In addition, because the vertical boundary 142 of the sensor 128 is not used in the above-described technique for setting the height V, instead of including four sensing regions S1-S4, the sensor may include only two sensing regions (top and bottom) and thus omit the boundary 142 as discussed above in conjunction with FIG. 10. Of course this top/bottom configuration may prohibit the use of the sensor 128 for correcting the phase error of PCLK and the horizontal amplitude error in the scan width D.

Moreover, instead of correcting the phase error of PCLK and the horizontal amplitude error in the width D of the scan region 74 before correcting the vertical amplitude error in the height V of the scan region, the circuit 122 may correct the vertical amplitude error first, where the circuit 122 may adjust V such that the horizontal boundary 140 intersects the center of the pixel 226 (or other pixel being used) regardless of the position of the pixel relative to the vertical boundary 142.

Furthermore, in a potentially less accurate alternative, the vertical height adjuster 132 may adjust V until at least one region S1-S4 of the sensor 128 detects the pixel 226 in the line 92. Because this alternative requires only one sensor regions, this alternative may be implemented with a single-sensing-region sensor such as the sensor 54 of FIGS. 5-6.

Figure 16:
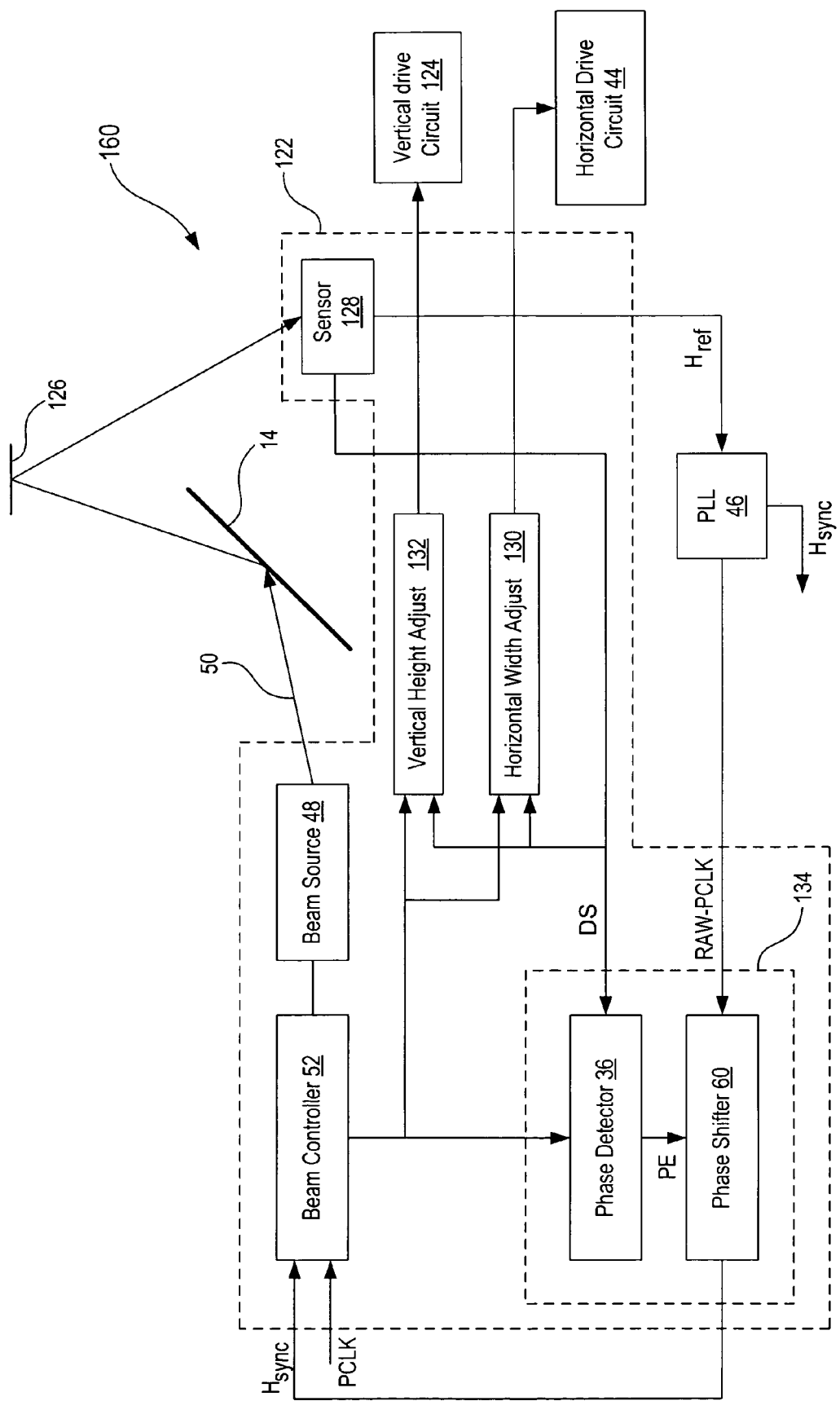
FIG. 16 is a block diagram of a scanned-image subsystem according to an embodiment that is similar to the scanned-image subsystem of FIG. 9 but that generates the pixel clock differently than the subsystem of FIG. 9.

FIG. 16 is a block diagram of a scanned image subsystem 160, which includes the circuit 122 and which is otherwise similar to the subsystem 120 of FIG. 9. However, the subsystem 160 is different than the subsystem 120 in that the PLL 46 of the subsystem 160 receives the horizontal reference signal $H_{ref}$ from the sensor 128 instead of from the horizontal drive circuit 44. The sensor 128 may generate $H_{ref}$ with less jitter than the horizontal drive circuit 44.

In operation of the subsystem 160 after the circuit 122 has corrected the phase of PCLK and has corrected the width D, and the height V of the scan region 74 (FIG. 10) as needed, once per vertical-scan cycle of the mirror 14 the beam controller 52 causes the beam 50 to generate a pixel (e.g., the pixel 226 in line 92) that strikes the sensor 128. In response to sensing the pixel, the sensor 128 generates a pulse $H_{ref}$ (e.g., $H_{ref}$ may be the same as one of the signals DS, or may be a summation of these signals). Of course, the phase of $H_{ref}$ is shifted by the number of the pixel that strikes the sensor 128. But because this phase shift is constant, one can program the phase shifter 60 to take it into account.

Figure 17:
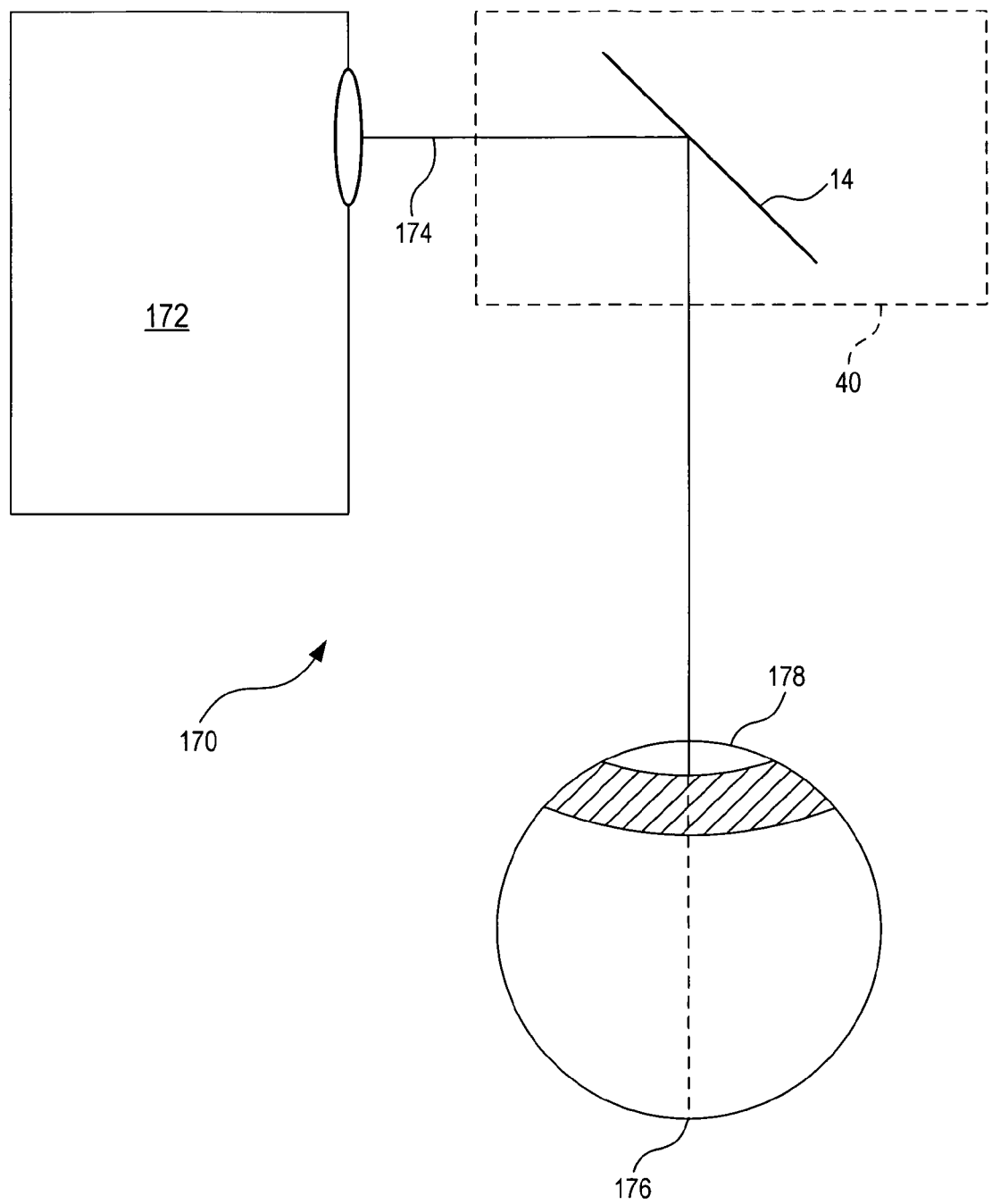
FIG. 17 is a block diagram of a scanned-image-generating system that can incorporate one or more of the scanned-image subsystems of FIGS. 5, 9, and 16 according to an embodiment.

FIG. 17 is a diagram of a virtual-retinal display (VRD) system 170 that may incorporate the image-scanning subsystem 40 of FIG. 5, the image-scanning subsystem 120 of FIG. 9, or the image-scanning subsystem 160 of FIG. 16. For purposes of illustration, FIG. 17 shows the system 170 incorporating the subsystem 40 of FIG. 5. In addition to the system 40, the system 170 includes a conventional beam generator 172 for generating an image beam 174. The mirror 14 is operable to sweep the image beam 174 across a display screen or surface such as a retina 176 to generate an image frame thereon. As stated above in conjunction with FIG. 5, the image beam 174 may be the same as or different from the synchronization beam 50. If these beams are the same, then the beam generator 172 may be disposed within the subsystem 40, or the subsystem 40 may be disposed within the beam generator 172.

In operation, the beam generator 172 directs the image beam 174 onto the mirror 14, which sweeps the beam 174 through a pupil 178 and across the retina 176 by rotating back and forth as discussed above in conjunction with FIG. 1.

Figure 18:
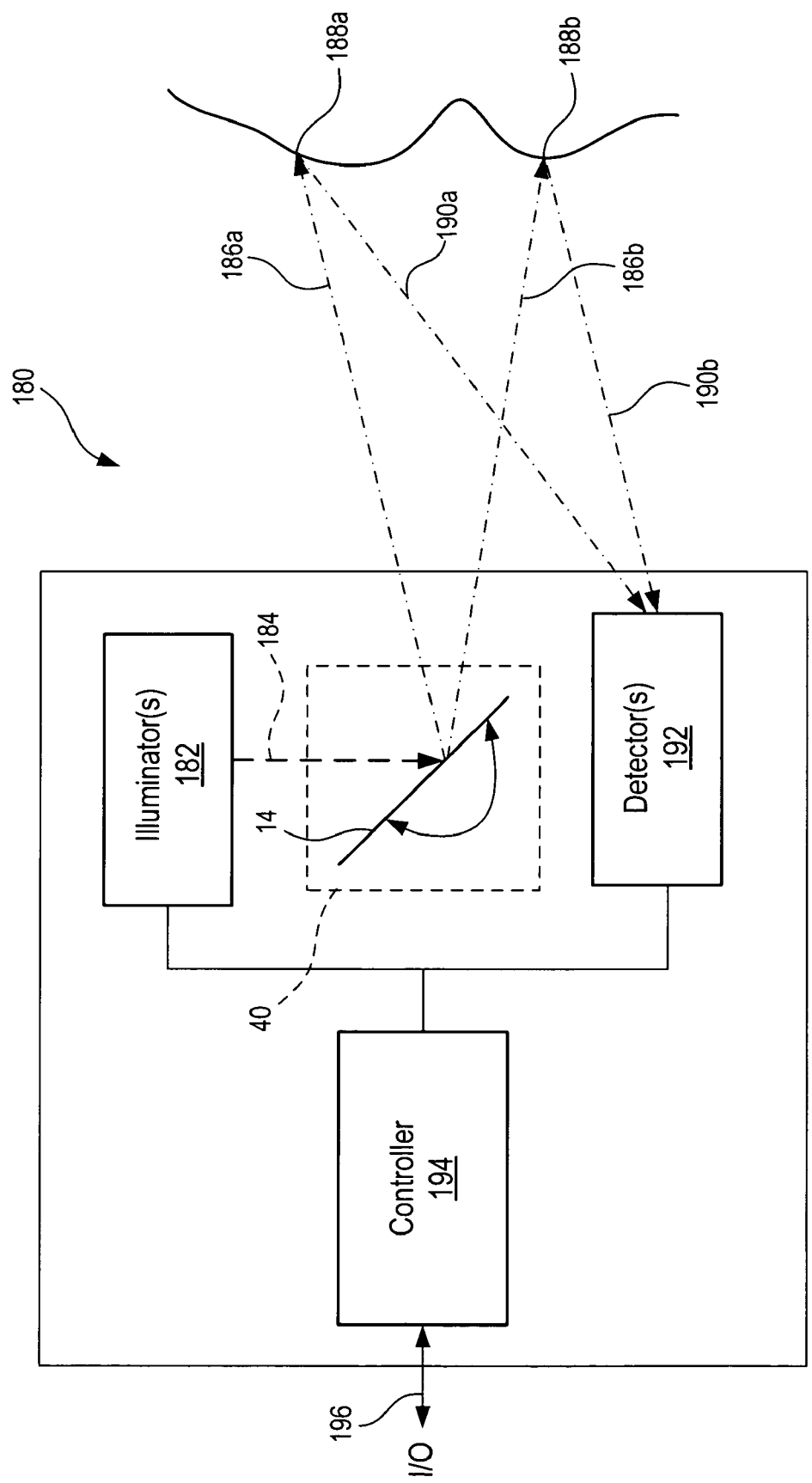
FIG. 18 is a block diagram of a scanned-image-capturing system that can incorporate one or more of the scanned-image subsystems of FIGS. 5, 9, and 16 according to an embodiment.

FIG. 18 is a block diagram of a scanned-beam imager system 180 that may incorporate the image-scanning subsystem 40 of FIG. 5, the image-scanning subsystem 120 of FIG. 9, or the image-scanning subsystem 160 of FIG. 16. For purposes of illustration, FIG. 18 shows the system 180 incorporating the subsystem 40 of FIG. 5. An illuminator 182 creates a first beam of light 184. The subsystem system 40 deflects the first beam of light across a field-of-view (FOV) to produce a second scanned beam of light 186, shown in two positions 186a and 186b. The scanned beam of light 186 sequentially illuminates spots 188 in the FOV, shown as positions 188a and 188b, corresponding to beam positions 186a and 186b, respectively. While the beam 186 illuminates the spots 188, the illuminating light beam 190 is reflected, absorbed, scattered, refracted, or otherwise affected by the properties of the object or material to produced scattered light energy. A portion of the scattered light energy 190, shown emanating from spot positions 188a and 188b as scattered energy rays 190a and 190b, respectively, travels to one or more detectors 192 that receive the light and produce electrical signals corresponding to the amount of light energy received. The electrical signals drive a controller 194 that builds up a digital image and transmits it for further processing, decoding, archiving, printing, display, or other treatment or use via interface 196.

Light source 182 may include multiple emitters such as, for instance, light-emitting diodes (LEDs), lasers, thermal sources, arc sources, fluorescent sources, gas discharge sources, or other types of illuminators. In some embodiments, illuminator 182 comprises a red laser diode having a wavelength of approximately 635 to 670 nanometers (nm). In another embodiment, illuminator 182 comprises three lasers; a red diode laser, a green diode-pumped solid state (DPSS) laser, and a blue DPSS laser at approximately 635 nm, 532 nm, and 473 nm, respectively. While laser diodes may be directly modulated, DPSS lasers generally require external modulation such as an acousto-optic modulator (AOM) for instance. In the case where an external modulator is used, it is considered part of light source 182. Light source 182 may include, in the case of multiple emitters, beam combining optics to combine some or all of the emitters into a single beam. Light source 182 may also include beam-shaping optics such as one or more collimating lenses and/or apertures. Additionally, while the wavelengths described are in the optically visible range, other wavelengths may be within the scope of the invention.

Light beam 184, while illustrated as a single beam, may comprise a plurality of beams converging on a single scanner mirror 14 or onto separate mirrors 14.

A 2D MEMS or other scanner 14 scans one or more light beams at high speed in a pattern that covers an entire 2D FOV or a selected region of a 2D FOV within a frame period. A typical frame rate may be 60 Hz, for example. Often, it is advantageous to run one or both scan axes resonantly. In one embodiment, one axis is run resonantly at about 19 KHz while the other axis is run non-resonantly in a sawtooth pattern so as to create a progressive scan pattern. A progressively scanned bidirectional approach with a single beam scanning horizontally at scan frequency of approximately 19 KHz and scanning vertically in sawtooth pattern at 60 Hz can approximate an SVGA resolution. In one such system, the horizontal scan motion is driven electrostatically and the vertical scan motion is driven magnetically. Alternatively, both the horizontal and vertical scan may be driven magnetically or capacitively. Electrostatic driving may include electrostatic plates, comb drives or similar approaches. In various embodiments, both axes may be driven sinusoidally or resonantly.

Several types of detectors may be appropriate, depending upon the application or configuration. For example, in one embodiment, the detector may include a simple PIN photodiode connected to an amplifier and digitizer. In this configuration, beam position information may be retrieved from the scanner or, alternatively, from optical mechanisms, and image resolution is determined by the size and shape of scanning spot 188. In the case of multi-color imaging, the detector 192 may comprise more sophisticated splitting and filtering to separate the scattered light into its component parts prior to detection. As alternatives to PIN photodiodes, avalanche photodiodes (APDs) or photomultiplier tubes (PMTs) may be preferred for certain applications, particularly low light applications.

In various approaches, simple photodetectors such as PIN photodiodes, APDs, and PMTs may be arranged to stare at the entire FOV, stare at a portion of the FOV, collect light retro-collectively, or collect light confocally, depending upon the application. In some embodiments, the photodetector 192 collects light through filters to eliminate much of the ambient light.

The present device may be embodied as monochrome, as full-color, and even as a hyper-spectral. In some embodiments, it may also be desirable to add color channels between the conventional RGB channels used for many color cameras. Herein, the term grayscale and related discussion shall be understood to refer to each of these embodiments as well as other methods or applications within the scope of the invention. In the control apparatus and methods described below, pixel gray levels may comprise a single value in the case of a monochrome system, or may comprise an RGB triad or greater in the case of color or hyperspectral systems. Control may be applied individually to the output power of particular channels (for instance red, green, and blue channels), may be applied universally to all channels, or may be applied to a subset of the channels.

In some embodiments, the illuminator may emit a polarized beam of light or a separate polarizer (not shown) may be used to polarize the beam. In such cases, the detector 192 may include a polarizer cross-polarized to the scanning beam 186. Such an arrangement may help to improve image quality by reducing the impact of specular reflections on the image.

From the foregoing it will be appreciated that, although specific embodiments of the invention have been described herein for purposes of illustration, various modifications may be made without deviating from the spirit and scope of the invention. For example, referring to FIGS. 5, 9, and 16 the synchronization beam 50 may be any type of electromagnetic beam, such as a light beam or an electron beam. Where the beam 50 is an electron beam, then the mirror 14 may be replaced with an electron-beam sweeping circuit. Furthermore, where an alternative is disclosed for a particular embodiment, this alternative may also apply to other embodiments even if not specifically stated.

What is claimed is:

1. An image system, comprising:
   a beam sweeper;
   a first driver operable to drive the beam sweeper in a first dimension such that the beam sweeper has a sweep phase;
   a clock generator operable to generate a pixel clock having a clock phase;
   a beam generator coupled to the clock generator and operable to direct a beam toward the beam sweeper in response to the pixel clock;
   a sensor operable to detect the beam redirected by the beam sweeper; and
   a phase detector coupled to the sensor and operable to detect an error in the clock phase from the detected beam; and
   further comprising a phase shifter coupled to the phase detector and operable to shift the clock phase in a direction that reduces the error in the clock phase, wherein the phase shifter is capable of adjusting the clock phase of the pixel clock in increments of less than one pixel.

2. The image system of claim 1 wherein the beam sweeper comprises a microelectricalmechanical scanner.

3. The image system of claim 1 wherein the first driver is operable to cause the beam sweeper to resonate in the dimension.

4. The image system of claim 1 wherein:
   the beam sweeper has a resonant sweep frequency in the first dimension; and
   the first driver is operable to drive the beam sweeper at a frequency that is within approximately 5% of the resonant sweep frequency.

5. The image system of claim 1 wherein:
   the first driver is operable to generate a drive signal at a drive frequency at which the first driver drives the beam sweeper; and
   the clock generator is coupled to the first driver and comprises a phase-locked loop that is operable to generate the pixel clock having a frequency that is as a multiple of the drive frequency.

6. The image system of claim 1 wherein:
   the first driver is operable to cause the beam sweeper to have a first sweep amplitude in the first dimension; and
   the phase detector is operable to detect an error in the first sweep amplitude from the detected beam and to provide to the first driver a correction signal that causes the driver to adjust the first sweep amplitude toward a predetermined value.

7. The image system of claim 1, further comprising:
   wherein the first driver is operable to cause the beam sweeper to have a first sweep amplitude in the first dimension;
   a second driver operable to drive the beam sweeper in a second dimension and to cause the beam sweeper to have a second sweep amplitude in the second dimension; and
   wherein the phase detector is operable to detect respective errors in the first and second sweep amplitudes from the detected beam and to provide to the first and second drivers respective first and second correction signals that cause the drivers to adjust the first and second sweep amplitudes towards respective first and second predetermined values.

8. The image system of claim 1 wherein the clock generator is coupled to the sensor and comprises a phase-locked loop that is operable to generate the pixel clock from the detected beam.

9. The image system of claim 1 wherein the sensor comprises a single sensing region.

10. The image system of claim 1 wherein the sensor comprises first and second contiguous sensing regions.

11. The image system of claim 1 wherein the sensor comprises four square quadrants that are contiguous at a point.

12. The image system of claim 1, further comprising a reflector operable to direct the beam as redirected by the beam sweeper to the sensor.

13. The image system of claim 1 wherein the sensor is disposed between a mid line and a side of a region that the beam sweeper is operable to scan in the first dimension.

* * * * *